US012565699B2

(12) United States Patent

Murata et al.

(10) Patent No.: US 12,565,699 B2

(45) Date of Patent: Mar. 3, 2026

(54) DEVICE FOR SUPPLYING A MIXED GAS, DEVICE FOR PRODUCING METAL NITRIDE FILM, AND METHOD FOR PRODUCING METAL NITRIDE FILM

(71) Applicant: TAIYO NIPPON SANSO CORPORATION, Tokyo (JP)

(72) Inventors: Hayato Murata, Tokyo (JP); Tadaki Mizuno, Tokyo (JP); Keisuke Andachi, Tokyo (JP); Katsumasa Suzuki, Tokyo (JP)

(73) Assignee: TAIYO NIPPON SANSO CORPORATION, Tokyo (JP)

( * ) Notice: Subject to any disclaimer, the term of this patent is extended or adjusted under 35 U.S.C. 154(b) by 578 days.

(21) Appl. No.: 17/927,106

(22) PCT Filed: May 6, 2021

(86) PCT No.: PCT/JP2021/017365
§ 371 (c)(1),
(2) Date: Nov. 22, 2022

(87) PCT Pub. No.: WO2021/241152
PCT Pub. Date: Dec. 2, 2021

(65) Prior Publication Data
US 2023/0193458 A1 Jun. 22, 2023

(30) Foreign Application Priority Data

May 29, 2020 (JP) ................................. 2020-094612

(51) Int. Cl.
*C23C 16/30* (2006.01)
*C23C 16/455* (2006.01)
*C23C 16/52* (2006.01)

(52) U.S. Cl.
CPC ...... *C23C 16/303* (2013.01); *C23C 16/45512* (2013.01); *C23C 16/45523* (2013.01); *C23C 16/52* (2013.01)

(58) Field of Classification Search
None
See application file for complete search history.

(56) References Cited

U.S. PATENT DOCUMENTS

| | | | | |
|---|---|---|---|---|
| 6,210,482 B1 * | 4/2001 | Kitayama | ................ | F17D 1/04 |
| | | | | 138/37 |
| 6,443,435 B1 * | 9/2002 | Hendrickson | ....... | H01J 37/3244 |
| | | | | 261/DIG. 65 |

(Continued)

FOREIGN PATENT DOCUMENTS

| | | |
|---|---|---|
| CN | 108713243 A | 10/2018 |
| JP | 2002-343793 | 11/2002 |

(Continued)

OTHER PUBLICATIONS

Examination Report from the Intellectual Property Office mailed Sep. 2, 2024 in Taiwanese Application No. 110118263, with English translation, 7 pages.

(Continued)

*Primary Examiner* — Jethro M. Pence
(74) *Attorney, Agent, or Firm* — Nixon & Vanderhye P.C.

(57) ABSTRACT

One object of the present invention is to provide a method for producing a metal nitride film that has a high film formation rate and excellent productivity. The present invention provides a method for producing a metal nitride film in which a metal nitride film is formed on at least a part of a surface of a substrate to be processed by chemical vapor deposition using a metal compound raw material and a (Continued)

nitrogen-containing compound raw material, wherein the nitrogen-containing compound raw material contains hydrazine and ammonia.

12 Claims, 11 Drawing Sheets

(56)                References Cited

U.S. PATENT DOCUMENTS

| | | | |
|---|---|---|---|
| 6,701,066 B2 * | 3/2004 | Sandhu | C23C 16/4485 |
| | | | 392/386 |
| 8,047,510 B2 * | 11/2011 | Hirata | C23C 16/4481 |
| | | | 261/65 |
| 10,047,436 B2 * | 8/2018 | Moroi | C23C 16/52 |
| 2005/0115504 A1 * | 6/2005 | Ueda | C23C 16/24 |
| | | | 118/723 R |
| 2009/0075490 A1 | 3/2009 | Dussarrat | |
| 2010/0012026 A1 * | 1/2010 | Hirata | G05D 16/024 |
| | | | 137/468 |
| 2010/0075483 A1 | 3/2010 | Ohno et al. | |
| 2010/0266765 A1 * | 10/2010 | White | C23C 16/45561 |
| | | | 427/248.1 |
| 2013/0340506 A1 * | 12/2013 | Suzuki | G01F 23/804 |
| | | | 73/53.01 |
| 2014/0124064 A1 * | 5/2014 | Hidaka | C23C 16/4481 |
| | | | 137/511 |
| 2014/0190581 A1 * | 7/2014 | Nagase | C23C 16/52 |
| | | | 137/624.27 |
| 2015/0007940 A1 * | 1/2015 | Kaneko | H01J 37/32201 |
| | | | 118/723 AN |
| 2016/0203978 A1 | 7/2016 | Hashimoto et al. | |
| 2023/0027528 A1 * | 1/2023 | Yamaguchi | C23C 16/52 |
| 2024/0123416 A1 * | 4/2024 | Rodriguez | C23C 16/54 |
| 2024/0309504 A1 * | 9/2024 | Kim | C23C 16/45561 |

FOREIGN PATENT DOCUMENTS

| | | |
|---|---|---|
| JP | 2005-26602 | 1/2005 |
| JP | 2008-41805 A | 2/2008 |
| JP | 2010-248624 | 11/2010 |
| JP | 2010-539730 | 12/2010 |
| JP | 2016-131210 | 7/2016 |
| JP | 2017-53039 | 3/2017 |
| JP | 2017-168644 | 9/2017 |
| JP | 2020-107651 | 7/2020 |
| JP | 2020-188100 | 11/2020 |

OTHER PUBLICATIONS

Office Action mailed Jul. 31, 2024 in Chinese Application No. 202180035830.6, with English translation of Search Report, 10 pages.

Masayuki Tanaka et al., "Film Properties of Low-k Silicon Nitride Films Formed by Hexachlorodisilane and Ammonia", Journal of The Electrochemical Society, 147 (6), 2010, pp. 2284-2289.

Shunsuke Morishita et al., "Atomic-layer chemical-vapor-deposition of silicon-nitride", Applied Surface Science, 112, 1997, pp. 198-204.

C. H. Ahn et al., "Characteristics of TiN Thin Films Grown by ALD Using TiCl4 and NH3", Metals and Materials International, vol. 7, No. 6 (2001), pp. 621-625.

International Search Report for PCT/JP2021/017365, mailed Jul. 6, 2021, 6 pages.

\* cited by examiner

DEVICE FOR SUPPLYING A MIXED GAS, DEVICE FOR PRODUCING METAL NITRIDE FILM, AND METHOD FOR PRODUCING METAL NITRIDE FILM

This application is the U.S. national phase of International Application No. PCT/JP2021/017365 filed May 6, 2021 which designated the U.S. and claims priority to JP 2020-094612 filed May 29, 2020, the entire contents of each of which are hereby incorporated by reference.

TECHNICAL FIELD

The present invention relates to a device for supplying a mixed gas, a device for producing a metal nitride film, and a method for producing a metal nitride film.

BACKGROUND ART

A metal nitride film is widely used in many applications due to its physical, chemical, electrical and mechanical properties. For example, silicon nitride (SiN) films are used for gate insulating films, sidewall spacers, and the like when forming transistors. Titanium nitride (TiN) films, tantalum nitride (TaN) films, and tungsten nitride (WN) films are used as barrier films for interconnections in integrated circuits.

Especially in recent years, the miniaturization of 3D transistor structures such as Fin-FET (Fin Field-Effect Transistor) in advanced logical technologies and the high integration of 3D-NAND have progressed further, and the horizontal and vertical dimensions of integrated circuits have decreased. Under these circumstances, there is a demand for a thin film-forming technique with sub-nm order film thickness control and good coverage characteristics.

Generally, a metal nitride film is formed by simultaneously or alternately supplying a raw material gas (metal compound raw material) and a reaction gas (nitrogen-containing compound raw material) into a processing chamber. Specifically, in the processing chamber, the metallic compound adsorbed on the surface of the substrate to be processed undergoes a chemical reaction with the nitrogen-containing compound due to thermal energy, and a thin film is formed on the surface of the substrate.

A method for alternately supplying the raw material gas and the reaction gas into a processing chamber to form a thin film is called Atomic Layer Deposition (ALD). In the ALD method, a film is formed one atomic layer at a time on the surface of the substrate to be processed, so a fine thin film of A order with good step coverage can be obtained. On the other hand, due to the characteristics of the ALD method, the productivity (that is, film deposition rate) is inferior to the chemical vapor deposition method (CVD).

Also, as one method in the ALD method, a plasma-assisted method capable of realizing film formation at a relatively low temperature by supplying a reaction gas in a plasma-activated state is known. However, the plasma-assisted method has major demerits such as inevitability of damage to the base material (substrate) to be processed, and inability to obtain good step coverage. Therefore, it is desired to form a metal nitride film at a low temperature by the conventional ALD method, and development of raw materials and film formation processes for film formation is underway.

It is generally known to use ammonia (NH$_3$) as the reaction gas in forming a silicon nitride film (Non-Patent Document 1 and Patent Document 1). In addition, it is known that in forming a silicon nitride film, it is possible to form a film at a low temperature by using an amine compound or a hydrazine compound as a substitute for ammonia. Specifically, Non-Patent Document 2 discloses a method for producing a silicon nitride film using hydrazine (N$_2$H$_4$) as the reaction gas.

On the other hand, it is known to use ammonia (NH$_3$) as the reaction gas in forming a metal nitride film other than a silicon nitride film. Specifically, Non-Patent Document 3 discloses a method for producing a titanium nitride film using tetrachlorotitanium (TiCl$_4$) as the raw material gas and ammonia (NH$_3$) as the reaction gas.

In addition, it is known that a hydrazine compound can be used as a substitute for ammonia in forming a metal nitride film other than a silicon nitride film. Specifically, Patent Document 2 discloses a method for producing a titanium nitride film using tetrachlorotitanium (TiCl$_4$) as the raw material gas and monomethylhydrazine (MMH: NH$_2$NH$_2$Me) as the reaction gas.

PRIOR ART DOCUMENTS

Patent Documents

Patent Document 1: Japanese Unexamined Patent Application, First Publication No. 2002-343793
Patent Document 2: Japanese Unexamined Patent Application, First Publication No. 2010-248624
Non-Patent Document 1: M. Tanaka et al., J. Electrochem. Soc. 147, 2284 (2000)
Non-Patent Document 2: S. Morishita et al., Appl. Surf. Sci. 112, 198 (1997)
Non-Patent Document 3: C. I. H. Ahn et al., METALS AND MATERIALS International, vol. 7, No. 6,621 (2001)

SUMMARY OF INVENTION

Problem to be Solved by the Invention

However, as shown in Non-Patent Document 1, Patent Document 1, and Non-Patent Document 3, when ammonia is used as the reaction gas in forming a metal nitride film, there is a problem in that the film formation rate is slow and the productivity is low. In particular, when the film formation temperature is set low (specifically, less than 350° C. in the formation of a titanium nitride film), not only is the film formation rate significantly reduced, but oxygen is incorporated into the film, resulting in poor film quality.

On the other hand, as shown in Non-Patent Document 2, and Patent Document 2, when a hydrazine compound (specifically, hydrazine, monomethyl hydrazine, and the like) is used as the reaction gas during formation of a metal nitride film, compared with using ammonia, the film formation rate is faster, and the film formation temperature can be lowered. However, a hydrazine compound is a highly toxic, highly reactive liquid material that requires careful handling and has a relatively low vapor pressure. When a hydrazine compound is used as the reaction gas instead of ammonia, there is a problem in that it is difficult to supply it safely into the processing chamber while maintaining a sufficient supply amount.

The present invention has been made in view of the above circumstances, and an object of the present invention is to provide a device for supplying a mixed gas capable of safely and stably supplying a mixed gas containing a nitrogen-containing compound raw material useful as a reaction gas for forming a nitride film.

Another object of the present invention is to provide a device for producing a metal nitride film and a method for producing a metal nitride film that have a high film formation rate and excellent productivity.

Means for Solving the Problem

In order to solve the above problems, the present invention provides the following device for supplying a mixed gas, device for producing a metal nitride film, and method for producing a metal nitride film.

(1) A device for supplying a mixed gas which supplies a mixed gas containing a hydrazine compound and ammonia as a nitrogen-containing compound raw material, wherein the device for supplying a mixed gas includes:

a raw material container which stores the hydrazine compound;

a heater which is located around the raw material container and heats the raw material container;

a heater control device which adjusts an output of the heater;

an introduction passage which introduces a carrier gas into the raw material container, a lead-out passage which leads out a gas containing the hydrazine compound from the raw material container;

a dilution gas supply passage which supplies a dilution gas, an ammonia supply passage which supplies the ammonia, a mixed gas lead-out passage which is connected with the lead-out passage, and leads out the mixed gas;

a dilution gas flow rate control device which is located in the mixed gas lead-out passage, and controls a flow rate of the dilution gas supplied into the dilution gas supply passage;

an ammonia flow rate control device which is located in the ammonia supply passage and controls a flow rate of ammonia supplied into the ammonia supply passage;

a mixed gas flow meter which is located in the mixed gas lead-out passage and measures a flow rate of the mixed gas which is led out into the mixed gas lead-out passage, and an arithmetic device which calculates a flow rate of the hydrazine compound contained in the mixed gas based on values of flow rate of the dilution gas, the ammonia, and the mixed gas;

wherein the ammonia supply passage is connected to at least one of the introduction passage, the lead-out passage, and the mixed gas lead-out passage, and wherein the dilution gas supply passage is connected to at least one of the introduction passage and the lead-out passage.

(2) The device for supplying a mixed gas according to (1), wherein the device for supplying a mixed gas further includes a bypass passage which is branched from the introduction passage and merges with the lead-out passage without passing through the raw material container.

(3) The device for supplying a mixed gas according to (1) or (2), wherein the device for supplying a mixed gas further includes:

a first pressure gauge which is located in the lead-out passage and measures pressure in the raw material container;

an on-off valve which is located in the lead-out passage or the mixed gas lead-out passage and of which an opening can be adjusted; and a pressure control device which controls an opening of the on-off valve based on a measured value of the first pressure gauge.

(4) The device for supplying a mixed gas according to (3), wherein the device for supplying a mixed gas further includes:

a storage tank which is located in the mixed gas lead-out passage and stores the mixed gas;

a second pressure gauge which measures pressure in the storage tank; and a flow path selection device which selects an open/closed state of the ammonia supply passage and the lead-out passage based on measured values of the first pressure gauge and the second pressure gauge.

(5) The device for supplying a mixed gas according to any one of (1) to (3), wherein the arithmetic device has a function of calculating a difference between a calculated flow rate and a set flow rate of the hydrazine compound, and updating a set value of the heater control device based on the difference.

(6) The device for supplying a mixed gas according to any one of (1) to (3), wherein the arithmetic device has a function of calculating a difference between a calculated content ratio and a set content ratio of the hydrazine compound contained in the mixed gas, and updating set values of the dilution gas flow rate control device and the ammonia flow rate control device based on the difference.

(7) The device for supplying a mixed gas according to (3), wherein the arithmetic device has a function of calculating a difference between a calculated content ratio and a set content ratio of the hydrazine compound contained in the mixed gas, and updating a set value of the pressure control device based on the difference.

(8) The device for supplying a mixed gas according to any one of (1) to (7), wherein a concentration of $H_2O$ contained in the nitrogen-containing compound raw material is 0.1 ppm or less.

(9) The device for supplying a mixed gas according to any one of (1) to (8), wherein a concentration of $H_2O$ contained in the hydrazine compound is 10 ppm or less.

(10) The device for supplying a mixed gas according to any one of (1) to (9), wherein the hydrazine compound is hydrazine ($N_2H4$).

(11) A device for producing a metal nitride film in which a metal nitride film is formed on at least a part of a surface of a substrate to be processed by chemical vapor deposition using a metal compound raw material and a nitrogen-containing compound raw material, wherein the device for producing a metal nitride film includes a device for supplying a mixed gas according to any one of (1) to (10).

(12) A method for producing a metal nitride film in which a metal nitride film is formed on at least a part of a surface of a substrate to be processed by chemical vapor deposition using a metal compound raw material and a nitrogen-containing compound raw material, wherein the nitrogen-containing compound raw material contains hydrazine and ammonia.

(13) The method for producing a metal nitride film according to (12), wherein the method includes:

a preparation step of placing the substrate to be processed in a processing chamber and controlling a surface temperature of the substrate to be processed to a required temperature; and a film formation step repeating a cycle including:

a step of supplying the metal compound raw material into the processing chamber;

a step of stopping the supply of the metal compound raw material;

a step of supplying the nitrogen-containing compound raw material into the processing chamber; and a step of stopping the supply of the nitrogen-containing compound raw material.

(14) The method for producing a metal nitride film according to (13), wherein the cycle further includes a step of supplying ammonia or ammonia diluted with an inert gas into the processing chamber.

(15) The method for producing a metal nitride film according to (13) or (14), wherein, in the step of supplying the nitrogen-containing compound raw material into the processing chamber, the ammonia is introduced into a raw material container for storing the hydrazine heated to a required temperature, and a mixed gas of the hydrazine and the ammonia led out from the raw material container is used as the nitrogen-containing compound raw material.

(16) The method for producing a metal nitride film according to (15), wherein, in the step of supplying the nitrogen-containing compound raw material into the processing chamber, the mixed gas prepared is stored in a storage tank, and the mixed gas led out from the storage tank is used as the nitrogen-containing compound raw material.

(17) The method for producing a metal nitride film according to (15) or (16), wherein a volumetric flow rate ratio between the hydrazine and the ammonia in the mixed gas is in a range from 1:99 to 50:50.

Effects of the Invention

The device for supplying a mixed gas of the present invention can safely and stably supply a mixed gas containing a nitrogen-containing compound raw material useful as a reaction gas for forming a nitride film.

Also, the device for producing a metal nitride film and the method for producing a metal nitride film of the present invention have a high film formation rate and excellent productivity.

DETAILED DESCRIPTION OF THE PREFERRED EMBODIMENTS

The following terms used in the present description have the following meanings.

"Nitrogen-containing compound raw material" means a material mainly containing a nitrogen-containing compound having one or more nitrogen atoms. Moreover, the nitrogen-containing compound raw material may contain two or more nitrogen-containing compounds within an appropriate range. In addition, the nitrogen-containing compound raw material may contain raw materials before purification, by-products generated when synthesizing the nitrogen-containing compound, and by-products generated during storage as impurities within an appropriate range.

"A metal nitride film" means a film containing a metal element and N atoms as main components. In addition, a metal nitride film may contain O atoms and C atoms within an appropriate range. Specifically, a metal nitride film may contain 0 to 30 atm % of O atoms and may contain 0 to 30 atm % of C atoms in the film.

"~" indicating a numerical range means that the numbers before and after it are included as lower and upper limits.

<Device for Producing a Metal Nitride Film>

Figure 1:
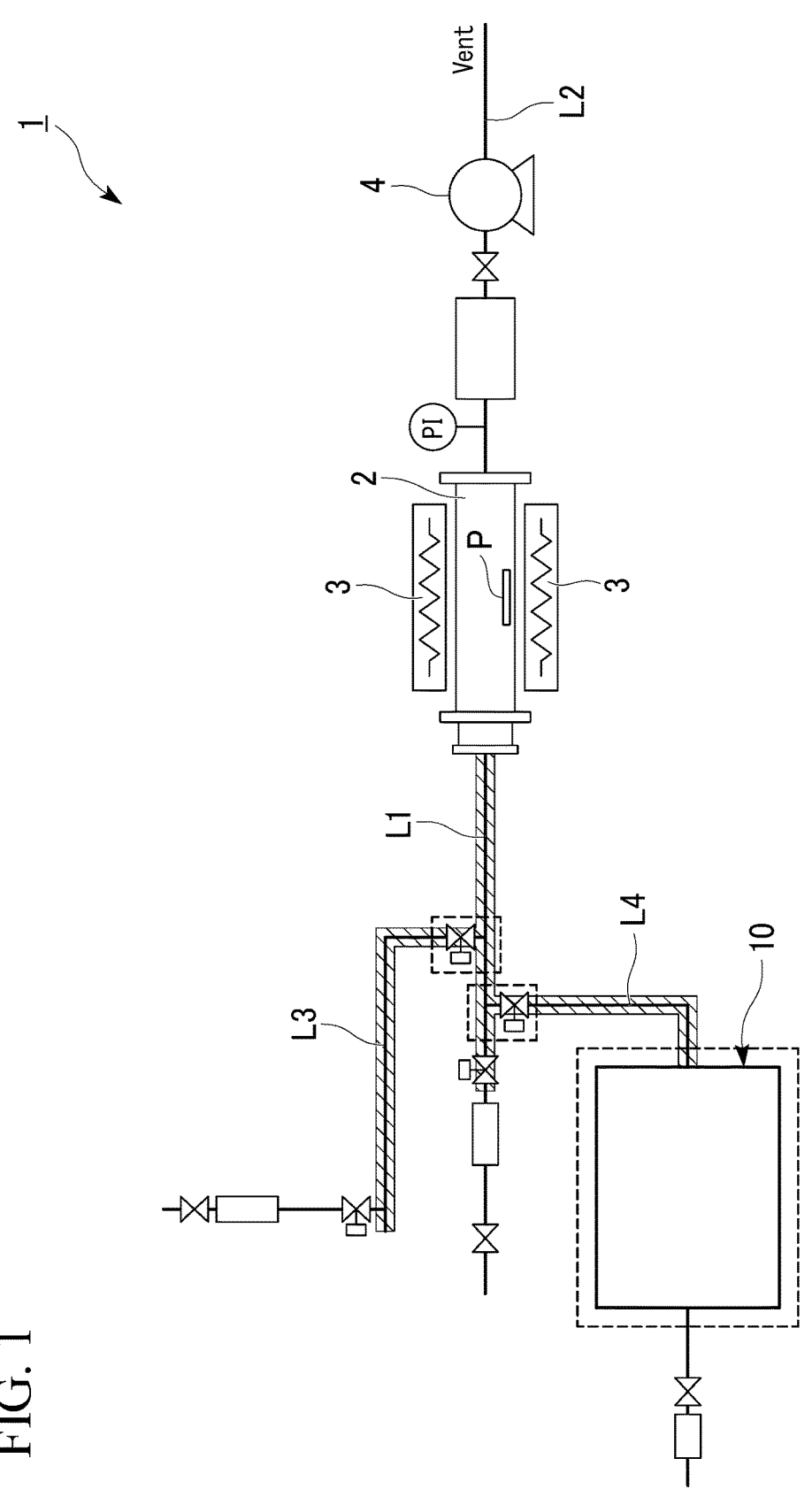
FIG. 1 is a system diagram schematically showing the configuration of one embodiment of the device for producing a metal nitride film of the present invention.

First, the device for producing a metal nitride film of the present invention will be described in detail with reference to the drawings. FIG. 1 is a system diagram schematically showing the configuration of one embodiment of the device for producing a metal nitride film of the present invention.

As shown in FIG. 1, the device for producing a metal nitride film (hereinafter also simply referred to as "film-forming device") 1 of the present embodiment includes a processing chamber 2 serving as a reaction field, a temperature control device 3 that controls the surface temperature of a substrate P to be processed in the processing chamber 2, a purge gas supply passage L1 that supplies a purge gas into the processing chamber 2, an exhaust passage L2 that exhausts the atmosphere in the processing chamber 2, a raw material gas supply passage L3 that supplies a metal compound raw material as a raw material gas, and a reaction gas supply passage L4 that supplies a nitrogen-containing compound raw material as a reaction gas.

The film-forming device 1 of the present embodiment forms a metal nitride film on at least a part of the surface of the substrate P to be processed by chemical vapor deposition using a metal compound raw material and a nitrogen-containing compound raw material. The film-forming device 1 is not particularly limited as long as it is applicable to the chemical vapor deposition method. As the film-forming device 1, a CVD (Chemical Vapor Deposition) device or an ALD (Atomic Layer Deposition) device can be used.

The substrate P to be processed is not particularly limited as long as it can form a metal nitride film on at least a part of the surface. The substrate P to be processed is not particularly limited, but examples thereof include semiconductor wafers, resins, and glass. Specifically, crystalline silicon (such as Si<100> or Si<111>), silicon oxide, strained silicon, SOI, silicon-germanium, germanium, doped or undoped polysilicon, doped or undoped silicon wafer, silicon nitride, silicon carbide, silicon carbonitride, silicon oxynitride, silicon carbonate, silicon carbonitride, metals such as Cu, Al, Ru, Ta, W, Ti, Co, Zr, and Hf, metal nitrides such as TiN, TaN and WN, metal oxides such as ZrO, HfO, TiO, TaO, and WO, patterned or unpatterned wafers, and semiconductor wafers containing at least one of the above In addition, resins such as polyethylene, polypropylene, polyolefin resins, polyvinyl chloride resins, fluorine resins, and polyester resins can also be used.

The metal nitride film is not particularly limited as long as it contains at least one metal element selected from the group consisting of silicon (Si), titanium (Ti), tantalum (Ta), aluminum (Al), gallium (Ga), vanadium (V), iron (Fe), zirconium (Zr), niobium (Nb), tungsten (W), molybdenum (Mo), indium (In), and hafnium (Hf). Among these, the metal nitride film containing at least one of silicon, titanium, and tantalum is preferable.

Specifically, examples of the silicon-containing metal nitride film include silicon nitride (SiN) films, silicon carbonitride (SiCN) films, silicon oxynitride (SiON) films, and silicon oxycarbonitride (SiOCN) films. Among these, silicon nitride films and silicon carbonitride films are preferable, and silicon nitride films are more preferable.

Example of the titanium-containing nitride films include titanium nitride (TiN) films, titanium carbonitride (TiCN) films, titanium oxynitride (TiON) films, and titanium oxycarbonitride (TiOCN) films. Among these, titanium nitride films and titanium carbonitride films are preferable, and titanium nitride films are more preferable.

The temperature control device 3 is not particularly limited as long as it can control the surface temperature of the substrate P to be processed in the processing chamber 2 to a required temperature. A heater and its control device can be used as the temperature control device 3.

The temperature control device 3 can heat the surface of the substrate P to be processed in the processing chamber 2 so as to be an arbitrary temperature. Specifically, the temperature can be controlled to be 500° C. or higher, and the temperature can also be controlled to be lower than 500° C. Furthermore, when the film formation at a low temperature is required, the surface temperature of the substrate P to be processed can be controlled to 450° C. or less.

The purge gas supply passage L1 supplies a purge gas into the processing chamber 2. The purge gas is not particularly limited, but includes rare gases such as helium (He), and argon (Ar), nitrogen ($N_2$), and hydrogen ($H_2$). Moreover, any one of these gases may be used as the purge gas, or two or more of these gases may be mixed and used.

The exhaust passage L2 exhausts atmospheric gases including the purge gas, the raw material gas, the reaction gas, and the like from the processing chamber 2 to reduce the pressure in the processing chamber 2. A decompression device 4 such as a decompression pump is located in the exhaust passage L2.

The raw material gas supply passage L3 merges with the purge gas supply passage L1, and supplies the metal compound raw material as the raw material gas into the processing chamber 2 via the purge gas supply passage L1. The raw material gas supply passage L3 is connected to a metal compound raw material supply source (not shown).

Examples of the metal compound raw material include, but are not particularly limited to, halogen metal compounds, organometallic compounds, and the like.

Specifically, examples of the metal halide compounds include $TiCl_4$, $Si_2Cl_6$ (HCDS: hexachlorodisilane), $SiCl_4$, $SiHCl_3$, $SiH_2Cl_2$, $SiH_3Cl$, $SiI_4$, $SiHI_3$, $SiH_2I_2$, $SiH_3I$, $TaCl_5$, $AlCl_3$, $GaCl_3$, $ZrCl_4$, $HfCl_4$, $MoCl_5$, $WF_6$, $WCl_6$, and $WCl_5$. Among these, it is preferable to use any one or more as the metal compound raw material.

Further, examples of the organometallic compounds include TDMAT (tetrakisdimethylaminotitanium), 3DMAS (trisdimethylaminosilane), BDEAS (bisdiethylaminosilane), BTBAS (bistertiarybutylaminosilane), PDMAT (pentakisdimethylaminotantalum), TMA (trimethylaluminum) and TMG (trimethylgallium). Among these, it is preferable to use any one or more as the metal compound raw material.

Note that the metal compound raw material may be supplied into the processing chamber 2 together with a carrier gas such as an inert gas.

Examples of the carrier gas include, but are not limited to, rare gases such as helium (He) and argon (Ar), nitrogen ($N_2$), and hydrogen ($H_2$). Any one of these carrier gases may be used, or a mixture of two or more may be used.

The reaction gas supply passage L4 merges with the purge gas supply passage L1, and supplies the nitrogen-containing compound raw material as the reaction gas into the processing chamber 2 via the purge gas supply passage L1. A device 10 for supplying a mixed gas is located in the reaction gas supply passage L4. That is, the film-forming device 1 of the present embodiment includes any one of devices 10 to 70 for supplying a mixed gas of the first to seventh embodiments described later as a supply source of the nitrogen-containing compound raw material, and the device for supplying a mixed gas supplies the mixed gas into the processing chamber 2 as the reaction gas.

<Device for Supplying a Mixed Gas>

Next, the device for supplying a mixed gas of the present invention will be explained with reference to the drawings.

The device for supplying a mixed gas of the present invention is a device that supplies a mixed gas containing a hydrazine compound and ammonia as a nitrogen-containing compound raw material.

First Embodiment

Figure 2:
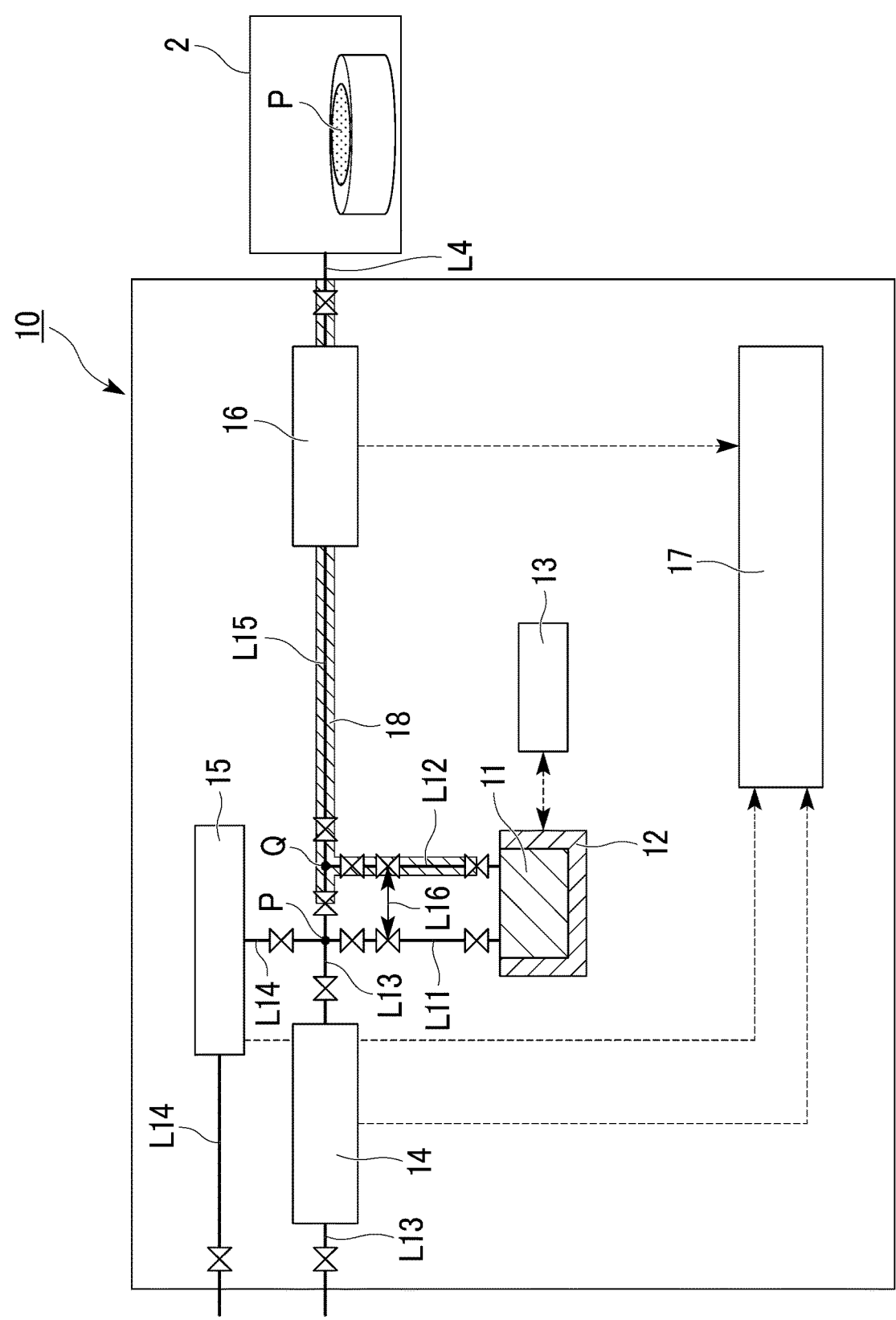
FIG. 2 is a system diagram schematically showing the configuration of a first embodiment of the device for supplying a mixed gas of the present invention.

FIG. 2 is a system diagram schematically showing the configuration of the first embodiment of the device for supplying a mixed gas of the present invention.

As shown in FIG. 2, the device 10 for supplying a mixed gas of the first embodiment includes a raw material container 11 storing a hydrazine compound, a heater 12 for heating the raw material container 11, a heater control device 13 for adjusting the output of the heater 12, an introduction passage L11 and a lead-out passage L12 connected to the raw material container 11, a dilution gas supply passage L13 that supplies a dilution gas, an ammonia supply passage L14 that supplies ammonia, a mixed gas lead-out passage L15 connected to the lead-out passage L12, a bypass passage L16 positioned between the introduction passage L11 and the lead-out passage L12, a dilution gas flow rate control device 14, an ammonia flow rate control device 15, a mixed gas flow meter 16, and a arithmetic device 17.

The raw material container 11 is a container (supply source) for storing a hydrazine compound, which is a nitrogen-containing compound.

The hydrazine compound is not particularly limited, but examples of the hydrazine compound include hydrazine ($N_2H_4$), monomethylhydrazine, dimethylhydrazine, tert-butylhydrazine, phenylhydrazine, propylhydrazine and the like. As the hydrazine compound, any one of these groups may be selected and used, or two or more may be mixed and used. In addition, in the device for producing a metal nitride film and the method for producing a metal nitride film of the present invention, it is preferable to use hydrazine alone as the hydrazine compound. By using only hydrazine, carbon derived from the hydrazine compound is not mixed into a metal nitride film, and significant deterioration in electrical properties can be prevented.

In general, hydrazine compounds are used as spacecraft propellants and rocket engine fuels, and are known to produce explosive reactions. In addition, hydrazine and monomethylhydrazine are highly toxic, and their permissible concentration (TLV-TWA) is 0.01 ppm, which is significantly lower than that of ammonia (permissible concentration: 25 ppm), phosphine (permissible concentration: 0.3 ppm), and monosilane (permissible concentration: 5 ppm) used in the semiconductor production process. In the NFPA (National Fire Protection Association), which is a standard indicating the danger of chemicals, hydrazine is 4-4-3 (Health-Flammability-Instability) and monomethyl hydrazine is 4-3-2, so that it is clear that sufficient consideration is required for safety in handling. For this reason, the raw material container 11 is preferably a sealed container.

The heater 12 is positioned around the raw material container 11 and heats the raw material container 11 so that the hydrazine compound in the raw material container 11 reaches a predetermined temperature range.

The heater 12 is not particularly limited as long as it can heat the raw material container 11. Examples of the heater 12 include a breeze heater, a mantle heater, a water bath, an oil bath, and the like. Among these, when heating the hydrazine compound in the container, it is preferable to use a water bath or an oil bath from the viewpoint of temperature uniformity and safety.

The heater control device 13 is not particularly limited as long as it can adjust (control) the output of the heater 12. The heater control device 13 may be integrated with the heater 12 as long as it has a function of adjusting (controlling) the output of the heater 12.

The temperature for heating the raw material container 11 by the heater 12 and the heater control device 13 is appropriately set according to the flow rate of the hydrazine compound raw material supplied. In addition, the heating temperature of the raw material container 11 is set below the decomposition temperature of the hydrazine compound in order to handle the hydrazine compound safely. Specifically, it is preferably set in the range of room temperature (20° C.) to 100° C., more preferably in the range of 30 to 60° C.

The introduction passage L11 is a line for introducing the carrier gas into the raw material container 11. A tip of the introduction passage L11 in the direction of the gas flow is connected to the raw material container 11. That is, the flow path inside the introduction passage L11 and the space inside the raw material container 11 communicate with each other.

The lead-out passage L12 is a line for leading out gas containing the hydrazine compound from the raw material container 11. A proximal end of the lead-out passage L12 in the direction of the gas flow is connected to the raw material container 11. That is, the flow path inside the lead-out passage L12 and the space inside the raw material container 11 communicate with each other.

In the device 10 for supplying a mixed gas of the present embodiment, the raw material container 11 is connected to the introduction passage L11 and the lead-out passage L12. Therefore, ammonia or a dilution gas, which will be described later, can be introduced into the raw material container 11 from the introduction passage L11 as a carrier gas, and the hydrazine compound accompanying the carrier gas can be led out into the lead-out passage L12 in a gaseous state. When introducing the carrier gas into the raw material container 11, it may be supplied by bubbling, or the carrier gas may be supplied to the gas phase (that is, vapor of the hydrazine compound) in the raw material container 11.

The mixed gas lead-out passage L15 is a passage that supplies the mixed gas containing the hydrazine compound and ammonia to the outside of the device 10 for supplying a mixed gas. A proximal end of the mixed gas lead-out passage L15 is connected to the lead-out passage L12 at a tip Q of the lead-out passage L12. Further, a tip of the mixed gas lead-out passage L15 is connected to the reaction gas supply passage L4 of the film-forming device 1 described above.

A pipe heater 18 is provided in the lead-out passage L12 and the mixed gas lead-out passage L15 so as to cover the surfaces of these pipes. By providing the pipe heater 18 in the passage through which the gas containing the hydrazine compound flows, the temperature can be maintained higher than the temperature of the raw material container 11. As a result, re-liquefaction of the hydrazine compound can be prevented in the lead-out passage L12 and the mixed gas lead-out passage L15, and the mixed gas containing the hydrazine compound can be safely and stably supplied into the reaction gas supply passage L4.

The bypass passage L16 is branched from the introduction passage L11 and merges with the lead-out passage L12 without passing through the raw material container 11. By selecting the bypass passage L16 as the flow path, the carrier gas supplied to the introduction passage L11 can be supplied into the lead-out passage L12 on the secondary side of the raw material container 11 without being introduced into the raw material container 11. Further, when removing the gas containing the hydrazine compound remaining in the lead-out passage L12, residual gas can be efficiently purged by supplying the dilution gas through the bypass passage L16.

The dilution gas supply passage L13 is a passage that supplies the dilution gas. In the present embodiment, the dilution gas supply passage L13 is connected to each of the introduction passage L11, the lead-out passage L12 and the mixed gas lead-out passage L15 at the base end P of the introduction passage L11 and the tip end Q of the lead-out passage L12 (that is, the base end of the mixed gas lead-out passage L15). Since the dilution gas supply passage L13 is connected to introduction passage L11, the dilution gas can be supplied into the introduction passage L11 as the carrier gas. In addition, the dilution gas supply passage L13 is connected to the lead-out passage L12 and the mixed gas lead-out passage L15. Therefore, a gas containing the hydrazine compound supplied from the lead-out passage L12 can be mixed with the dilution gas supplied from the dilution gas supply passage L13 to adjust the concentration, and then the mixed gas can be supplied into the mixed gas lead-out passage L15.

Examples of the dilution gas include, but are not limited to, rare gases such as helium (He) and argon (Ar), nitrogen ($N_2$), hydrogen ($H_2$), and the like. As the dilution gas, any one of these may be used, or two or more may be mixed and used. In addition, in the device 10 for supplying a mixed gas of the present embodiment, the dilution gas is an optional component, so it may not be used.

The ammonia supply passage L14 is a passage that supplies ammonia, which is a nitrogen-containing compound, in the gaseous state. In the present embodiment, the ammonia supply passage L14 is connected to the introduction passage L11 at a proximal end P of the introduction passage L11. Since the ammonia supply passage L14 is connected with the introduction passage L11, ammonia can be supplied into the introduction passage L11 as the carrier gas. Further, by selecting the bypass passage L16 as the flow path, ammonia can be supplied into the lead-out passage L12 on the secondary side of the raw material container 11 without passing through the raw material container 11. Furthermore, since the ammonia supply passage L14 is connected to the dilution gas supply passage L13, the gas containing the hydrazine compound supplied from the lead-out passage L12 is mixed with the ammonia supplied from the dilution gas supply passage L13 to adjust the concentration, and then the mixed gas can be supplied into the mixed gas lead-out passage L15. In addition, when supplying ammonia, the dilution gas may be included.

In the device 10 for supplying a mixed gas of the present embodiment, each passage is provided with one or more on-off valves, and by appropriately selecting the open/closed state of the on-off valves, it is possible to form an arbitrary flow path according to the purpose.

The dilution gas flow rate control device 14 is located in the dilution gas supply passage L13. The dilution gas flow rate control device 14 controls the flow rate of the dilution gas supplied into the dilution gas supply passage L13. The dilution gas flow rate control device 14 is not particularly limited as long as it can control the flow rate. Examples of the dilution gas flow rate control device 14 include a mass flow controller (MFC) and a pressure regulator capable of controlling the opening.

The ammonia flow rate control device 15 is located in the ammonia supply passage L14. The ammonia flow rate control device 15 controls the flow rate of ammonia supplied into the ammonia supply passage L14. The ammonia flow rate control device 15 is not particularly limited as long as it can control the flow rate. Examples of the ammonia flow rate control device 15 include a mass flow controller (MFC) and a pressure regulator capable of controlling the opening.

The flow rate of the ammonia supplied into the ammonia supply passage L14 is not particularly limited, and can be selected as appropriate. The control range of the flow rate of the ammonia by the ammonia flow rate control device 15 is preferably in the range of 10 to 10,000 sccm.

The mixed gas flow meter 16 is located in the mixed gas lead-out passage L15. The mixed gas flow meter 16 measures the flow rate of the mixed gas flow led out into the mixed gas lead-out passage L15. The mixed gas flowmeter 16 is not particularly limited as long as it can measure the flow rate. The mixed gas flow meter 16 may be, for example, a mass flow meter (MFM).

The arithmetic device 17 calculates the flow rate of the hydrazine compound contained in the mixed gas. The arithmetic device 17 can transmit and receive electric signals to and from the dilution gas flow rate control device 14, the ammonia flow rate control device 15, and the mixed gas flow meter 16 by wire or wirelessly. As a result, the arithmetic device 17 receives the values of the flow rate of the dilution gas, the ammonia, and the mixed gas as electric signals, and based on these values, the flow rate of the hydrazine compound contained in the mixed gas and a content ratio of the hydrazine contained in the mixed gas can be calculated.

According to the device 10 for supplying a mixed gas of the present embodiment, by introducing ammonia as the carrier gas into the raw material container 11 from the introduction passage L11, the mixed gas containing the hydrazine compound and ammonia can be safely and stably led out into the mixed gas lead-out passage L15. This is more preferable because it enables efficient entrainment of vapors of many hydrazine compounds contained in the raw material container 11.

Further, according to the device 10 for supplying a mixed gas, the carrier gas may be a dilution gas or a mixed gas of ammonia and the dilution gas.

Further, according to the device 10 for supplying a mixed gas, when ammonia is not used as the carrier gas, ammonia may be supplied into the mixed gas lead-out passage L15 via the dilution gas supply passage L13, or into the lead-out passage L12 via the ammonia supply passage L14, the introduction passage L11, and the bypass passage L16. Thereby, the mixed gas containing the hydrazine compound and ammonia can be led out into the mixed gas lead-out passage L15.

Further, according to the device 10 for supplying a mixed gas, when the dilution gas is not used as the carrier gas, the dilution gas may be supplied from the dilution gas supply passage L13 into the mixed gas lead-out passage L15. Alternatively, the mixed gas diluted to an arbitrary concentration can be led out into the mixed gas lead-out passage L15 by supplying the dilution gas via the dilution gas supply passage L13, the introduction passage 11, and the bypass passage L16.

In addition, according to the device 10 for supplying a mixed gas, since the flow rate of the dilution gas, the ammonia, and the mixed gas is monitored in the arithmetic device 17, the flow rate of the hydrazine compound contained in the mixed gas and the content ratio of the hydrazine compound contained in the mixed gas can be grasped regardless of the presence or absence of the dilution gas.

Second Embodiment

Figure 3:
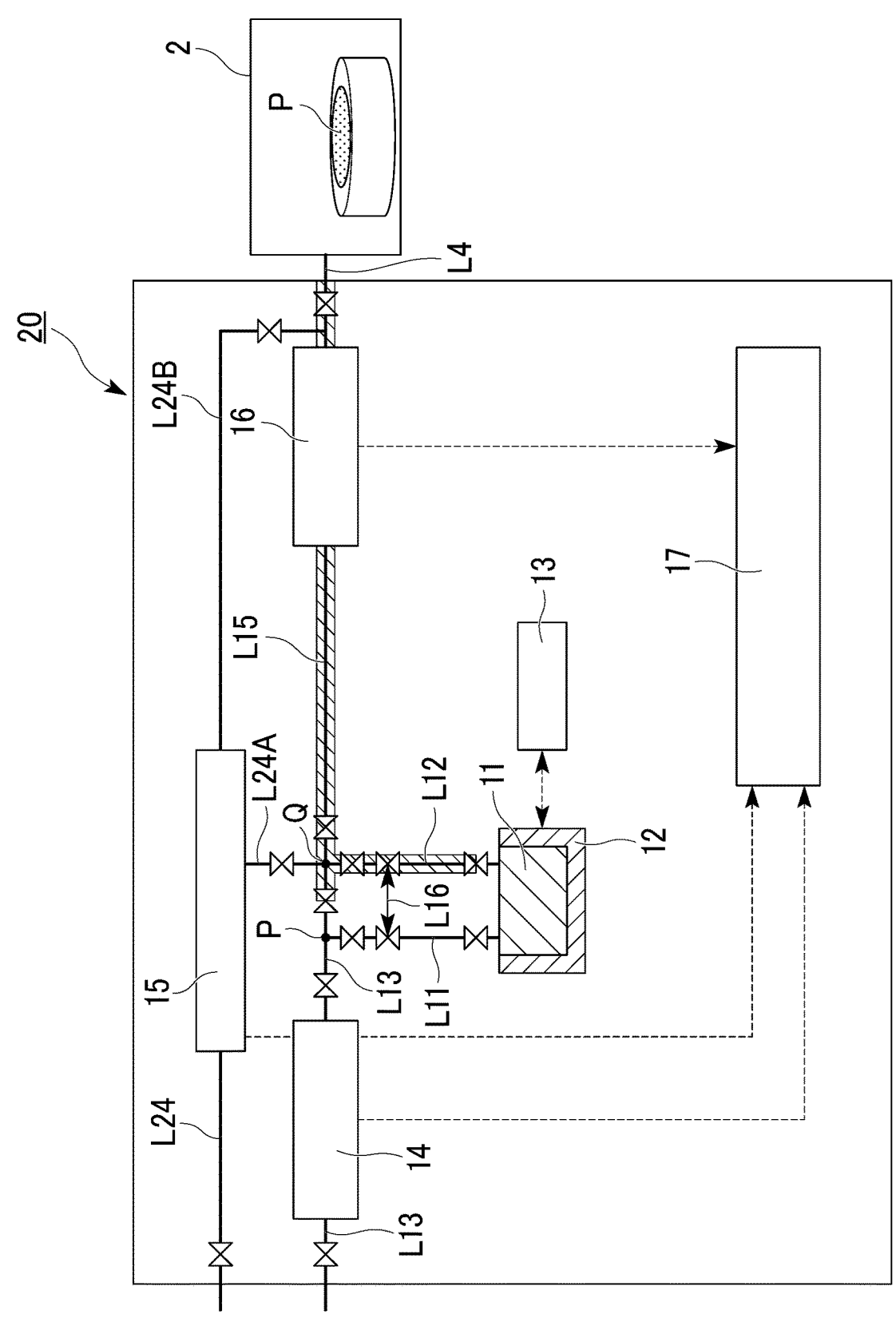
FIG. 3 is a system diagram schematically showing the configuration of a second embodiment of the device for supplying a mixed gas of the present invention.

FIG. 3 is a system diagram schematically showing the configuration of the second embodiment of the device for supplying a mixed gas of the present invention.

As shown in FIG. 3, the device 20 for supplying a mixed gas of the second embodiment has the same configuration as that of the device 10 for supplying a mixed gas except that the device 20 for supplying a mixed gas of the second embodiment includes an ammonia supply passage L24 instead of the ammonia supply passage L14. In the device 20 for supplying a mixed gas of the present embodiment, the same components as in the device 10 for supplying a mixed gas are denoted by the same reference numerals, and descriptions thereof are omitted.

The ammonia supply passage L24 is a passage that supplies ammonia, which is the nitrogen-containing compound, in the gas stage. In the present embodiment, the ammonia supply passage L24 branches into a passage L24A and a passage L24B on the secondary side of the ammonia flow rate control device 15. In addition, each of the passages L24A and L24B is provided with an on-off valve, and the passage can be appropriately selected by combining the open/closed states of these on-off valves.

The passage L24A is connected to the mixed gas lead-out passage L15 at the proximal end Q of the mixed gas lead-out passage L15.

When the passage L24A is selected, since the passage L24A is connected to the mixed gas lead-out passage L15, ammonia is supplied to the gas containing the hydrazine compound supplied from the lead-out passage L12, and then the mixed gas can be supplied into the mixed gas lead-out passage L15. In addition, since the arithmetic device 17 monitors the flow rate of the dilution gas, the ammonia, and the mixed gas, the flow rate of the hydrazine compound contained in the mixed gas and the content ratio of the hydrazine compound contained in the mixed gas can be grasped, regardless of the presence or absence of the dilution gas.

The passage L24B is connected to the mixed gas lead-out passage L15 on the secondary side of the mixed gas flow meter 16.

When passage L24B is selected, the gas containing the hydrazine compound and ammonia can be mixed in the mixed gas lead-out passage L15 because the passage L24B is connected to the mixed gas lead-out passage L15. In addition, since the arithmetic device 17 monitors the flow rate of the dilution gas, and the mixed gas, the flow rate of the hydrazine compound can be calculated regardless of the presence or absence of the dilution gas. Furthermore, the content ratio of the hydrazine compound contained in the mixed gas on the secondary side of the mixed gas flow meter 16 can be grasped from the flow rate of the ammonia.

According to the device 20 for supplying a mixed gas of the present embodiment, similar to the device 10 for supplying a mixed gas described above, the mixed gas containing the hydrazine compound and ammonia can be safely and stably led out into the mixed gas lead-out passage L15.

Third Embodiment

Figure 4:
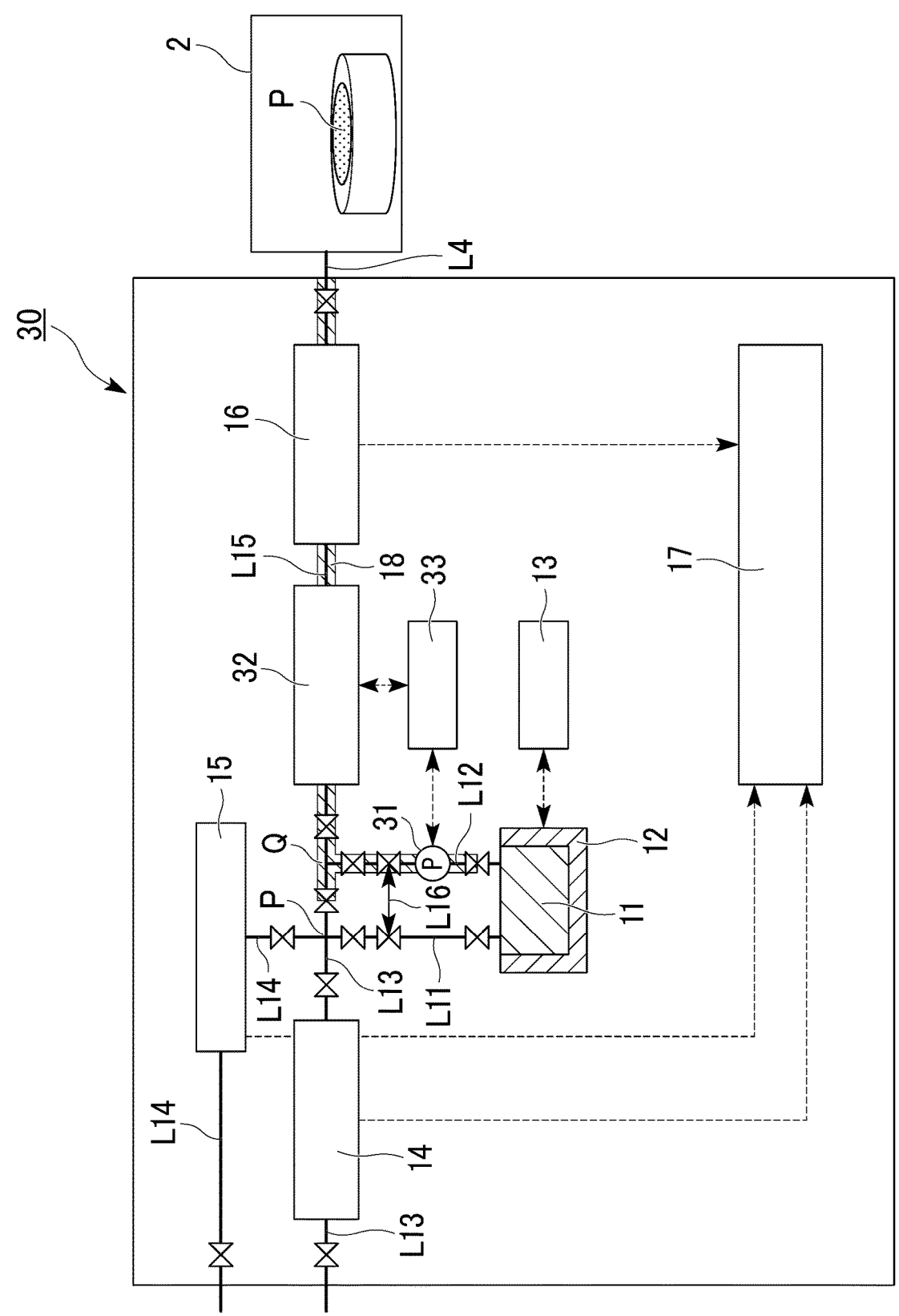
FIG. 4 is a system diagram schematically showing the configuration of a third embodiment of the device for supplying a mixed gas of the present invention.

FIG. 4 is a system diagram schematically showing the configuration of the third embodiment of the device for supplying a mixed gas of the present invention.

As shown in FIG. 4, the device 30 for supplying a mixed gas of the third embodiment has the same configuration as that of the device 10 for supplying a mixed gas of the first embodiment, except that the device 30 for supplying a mixed gas of the third embodiment further includes a first pressure gauge 31, an on-off valve 32, and a pressure control device 33. Therefore, in the device 30 for supplying a mixed gas of the present embodiment, the same components as in the device 10 for supplying a mixed gas are denoted by the same reference numerals, and descriptions thereof are omitted.

The first pressure gauge 31 is located in the lead-out passage L12 and measures the pressure in the raw material container 11.

The on-off valve 32 is located in the lead-out passage L12 or the mixed gas lead-out passage L15. The opening of the on-off valve 32 can be freely adjusted from fully closed (0% opening) to fully open (100% opening).

The pressure control device 33 can transmit and receive electric signals to and from the first pressure gauge 31 and the on-off valve 32 by wire or wirelessly. Specifically, the pressure control device 33 transmits a control signal to the on-off valve 32 for adjusting the opening of the on-off valve 32 based on the measured value of the pressure in the raw material container 11 received from the first pressure gauge 31.

According to the device 30 for supplying a mixed gas of the present embodiment, similar to the device 10 for supplying a mixed gas described above, the mixed gas containing the hydrazine compound and ammonia can be safely and stably led out into the mixed gas lead-out passage L15.

In addition, according to the device 30 for supplying a mixed gas of the present embodiment, the first pressure gauge 31 and the on-off valve 32 are interlocked via the pressure control device 33 so that the pressure in the raw material container 11, the lead-out passage L12, and the mixed gas lead-out passage L15 can be freely controlled.

Moreover, according to the device 30 for supplying a mixed gas of the present embodiment, the vapor pressure of the hydrazine compound can be measured by the first pressure gauge 31 when the carrier gas is not supplied into the raw material container 11.

Fourth Embodiment

Figure 5:
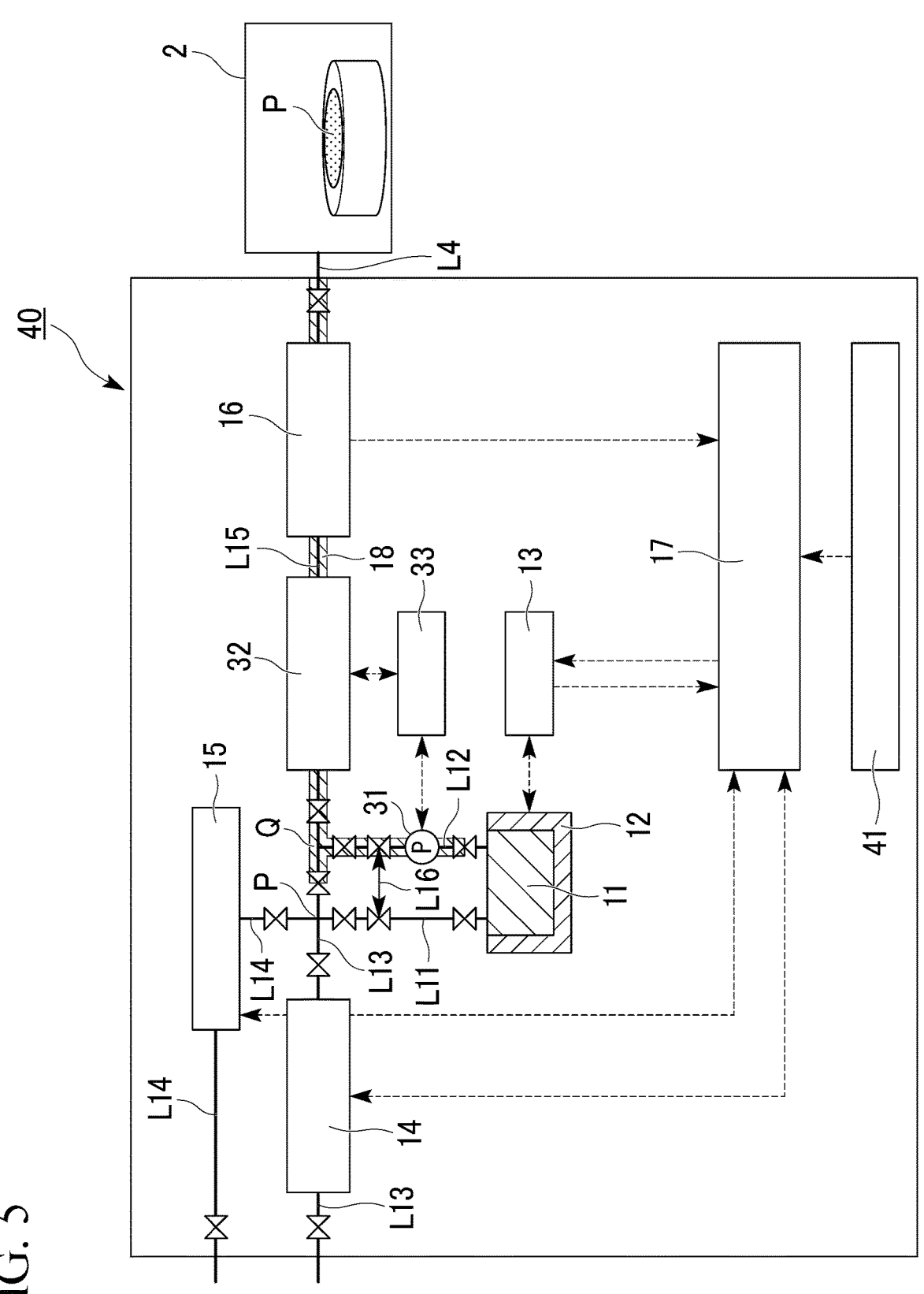
FIG. 5 is a system diagram schematically showing the configuration of a fourth embodiment of the device for supplying a mixed gas of the present invention.

FIG. 5 is a system diagram schematically showing the configuration of the fourth embodiment of the device for supplying a mixed gas of the present invention.

As shown in FIG. 5, the device 40 for supplying a mixed gas of the fourth embodiment has the same configuration as that of the device 30 for supplying a mixed gas of the third embodiment, except that the device 40 for supplying a mixed gas of the present embodiment further includes a setting device 41. Therefore, in the device 40 for supplying a mixed gas of the present embodiment, the same components as those of the device 30 for supplying a mixed gas are denoted by the same reference numerals, and descriptions thereof are omitted.

The setting device 41 is a device for inputting the flow rate of the hydrazine compound in the mixed gas and the content ratio of the ammonia and the hydrazine compound in the mixed gas as set values.

In addition to the functions described above, the arithmetic device 17 can transmit and receive electrical signals to and from the setting device 41 and the heater control device 13 by wire or wirelessly. Specifically, the arithmetic device 17 calculates the difference between the calculated value of the flow rate of the hydrazine compound and the set value referred to by the setting device 41, and updates (corrects, changes) the set value of the heater control device 13 based on this difference.

According to the device 40 for supplying a mixed gas of the present embodiment, similar to the device 30 for supplying a mixed gas described above, the mixed gas containing the hydrazine compound and ammonia can be safely and stably led out into the mixed gas lead-out passage L15.

Further, according to the device 40 for supplying a mixed gas of the present embodiment, the set value of the heating temperature of the raw material container 11 can be updated automatically such that the flow rate and the content ratio of the hydrazine compound calculated by the arithmetic device 17 are the set flow rate and content ratio. That is, when the calculated value of the flow rate of the hydrazine compound is insufficient for the set value, or when the flow rate of the hydrazine compound decreases as the supply of the mixed gas progresses, the vapor pressure of the hydrazine compound in the raw material container 11 is insufficient. Therefore, by automatically adjusting the temperature for heating the raw material container 11 (that is, the set value of the heater control device 13) to match the set value, the mixed gas can be supplied more stably.

On the other hand, when the calculated flow rate of the hydrazine compound exceeds the set value, the vapor pressure of the hydrazine compound in the raw material container 11 is excessive. Therefore, the output of the heater 12 that heats the raw material container 11 can be temporarily stopped to lower the temperature inside the raw material container 11. Therefore, according to the device 40 for supplying a mixed gas of the present embodiment, the mixed gas can be supplied more safely.

Moreover, the device 40 for supplying a mixed gas of the present embodiment may have an interlock that forcibly closes the on-off valve located in the passage near the raw material container 11. As a result, the flow rate of the hydrazine compound can be reliably stopped.

Further, it may be configured such that the supply of the ammonia and the dilution gas may also be forcibly stopped in accordance with the stoppage of the supply of the hydrazine compound. In addition, it may be configured such that only the dilution gas is automatically supplied so that the ammonia and the hydrazine compounds do not remain in the passage. Furthermore, it may be configured to forcibly close all on-off valves in the device 40 for supplying a mixed gas. By providing these interlock mechanisms, it is possible to prevent excessive supply of the hydrazine compound, so that the mixed gas can be supplied more safely.

Fifth Embodiment

Figure 6:
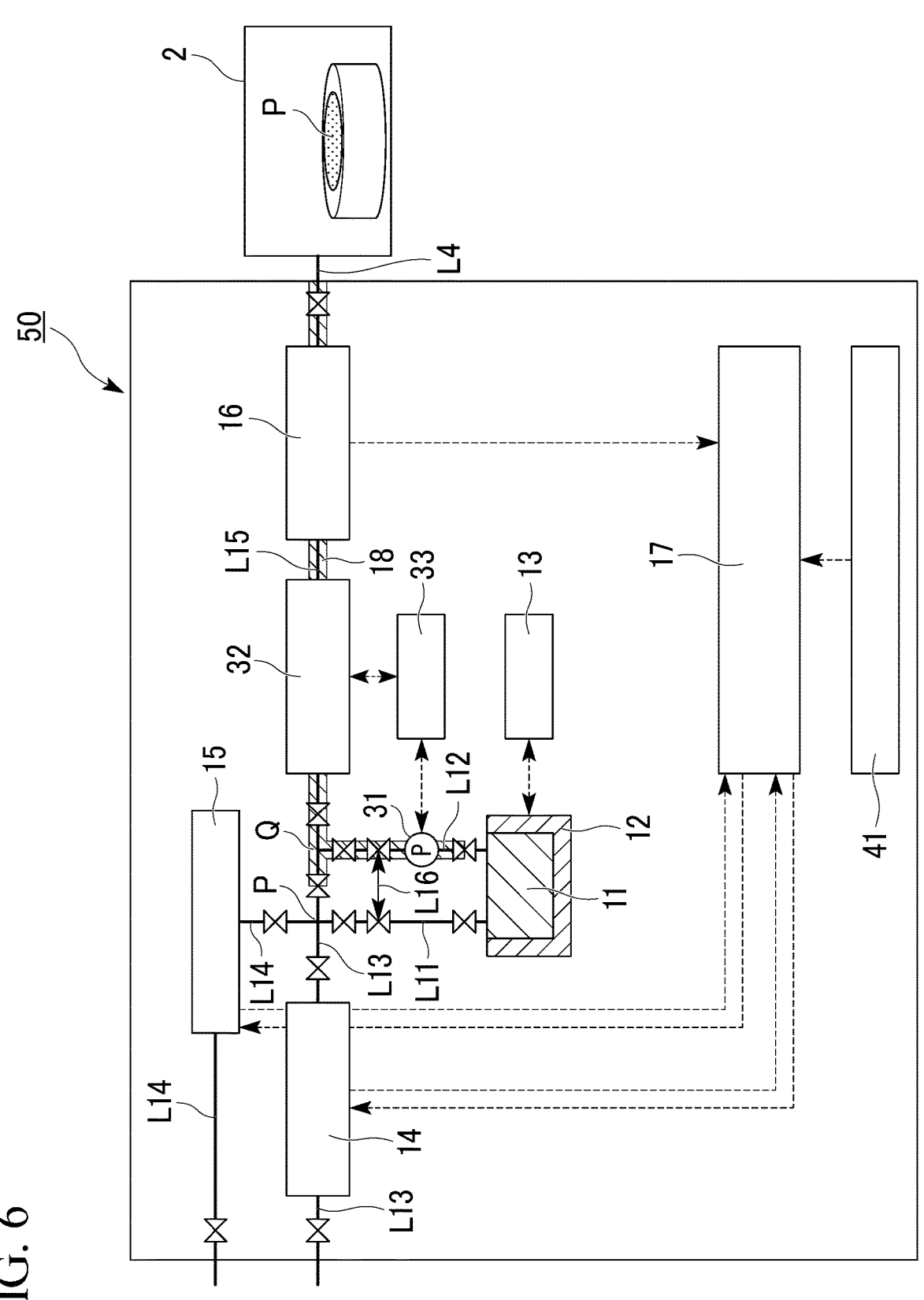
FIG. 6 is a system diagram schematically showing the configuration of a fifth embodiment of the device for supplying a mixed gas of the present invention.

FIG. 6 is a system diagram schematically showing the configuration of the fifth embodiment of the device for supplying a mixed gas of the present invention.

As shown in FIG. 6, the device 50 for supplying a mixed gas of the fifth embodiment has the same configuration as that of the device 40 for supplying a mixed gas of the fourth embodiment, except that the function of the arithmetic device 17 in the device 50 for supplying a mixed gas is different from that of the arithmetic device 17 in the device 40 for supplying a mixed gas. Therefore, in the device 50 for supplying a mixed gas of the present embodiment, the same components as those of the device 40 for supplying a mixed gas are denoted by the same reference numerals, and descriptions thereof are omitted.

In addition to the functions described above, the arithmetic device 17 can transmit and receive electric signals to and from the setting device 41, the dilution gas flow rate control device 14, and the ammonia flow rate control device 15 by wire or wirelessly. Specifically, the arithmetic device 17 calculates the difference between the calculated value of the flow rate of the hydrazine compound and the set value referred to by the setting device 41, and based on this difference, updates (corrects, changes) the set value of the dilution gas flow rate control device 14 and the ammonia flow rate control device 15.

According to the device 50 for supplying a mixed gas of the present embodiment, similar to the device 40 for supplying a mixed gas described above, the mixed gas containing the hydrazine compound and ammonia can be safely and stably led out into the mixed gas lead-out passage L15.

Further, according to the device 50 for supplying a mixed gas of the present embodiment, the set values of the dilution gas flow rate control device 14 and the ammonia flow rate control device 15 can be updated automatically such that the flow rate and the content ratio of the hydrazine compound calculated by the arithmetic device 17 are the set flow rate and content ratio.

Sixth Embodiment

Figure 7:
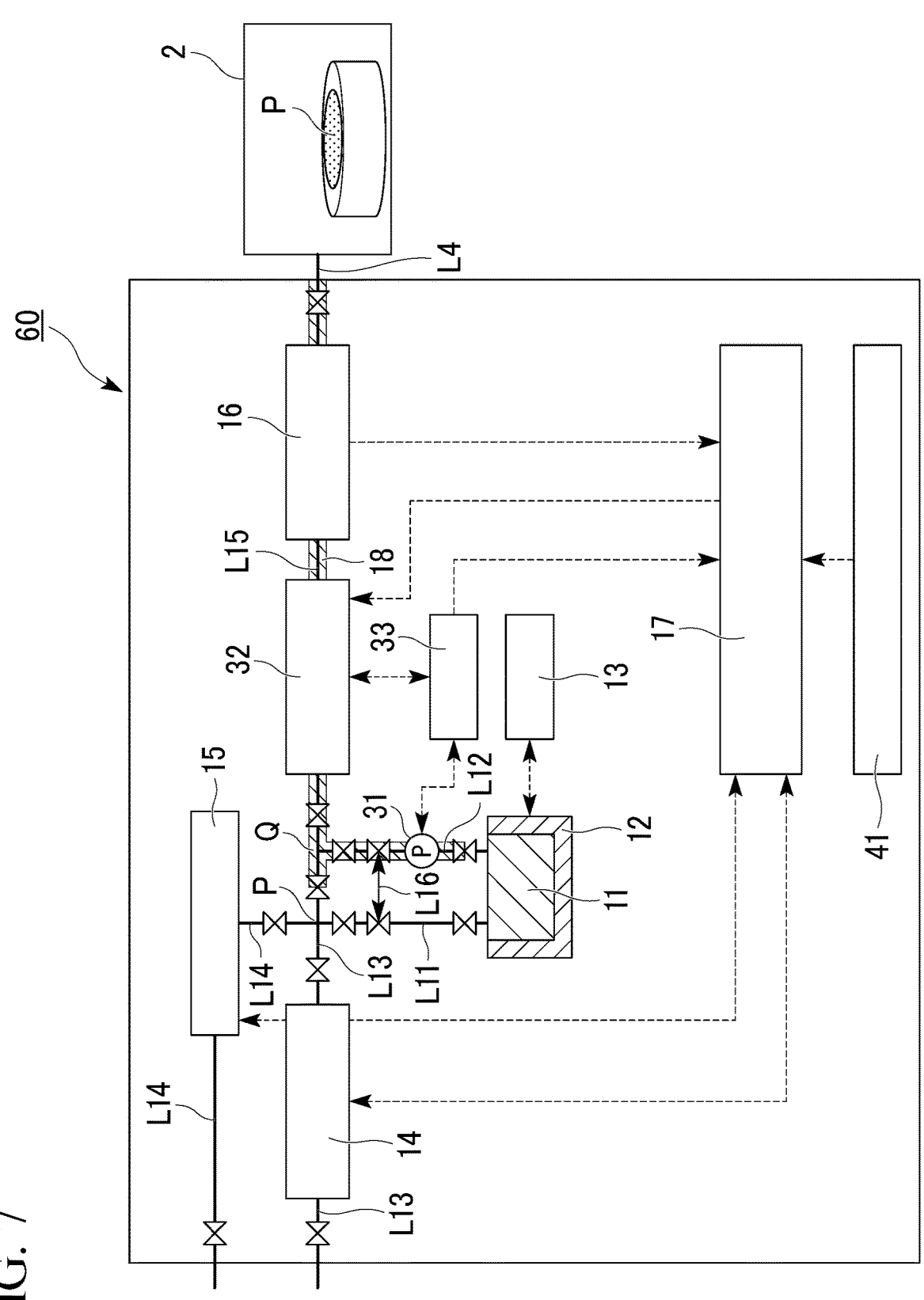
FIG. 7 is a system diagram schematically showing the configuration of a sixth embodiment of the device for supplying a mixed gas of the present invention.

FIG. 7 is a system diagram schematically showing the configuration of the sixth embodiment of the device for supplying a mixed gas of the present invention.

As shown in FIG. 7, the device 60 for supplying a mixed gas of the sixth embodiment has the same configuration as that of the devices 40 and 50 for supplying a mixed gas of the fourth and fifth embodiments, except that the function of the arithmetic device 17 in the device 60 for supplying a mixed gas is different from that of the arithmetic device 17 in the device 40 and 50 for supplying a mixed gas. Therefore, in the device 60 for supplying a mixed gas of the present embodiment, the same components as those of the devices 40 and 50 for supplying a mixed gas are denoted by the same reference numerals, and descriptions thereof are omitted.

In addition to the functions described above, the arithmetic device 17 can transmit and receive electric signals to and from the setting device 41, and the pressure control device 33 by wire or wirelessly. Specifically, the arithmetic device 17 calculates the difference between the calculated value of the flow rate of the hydrazine compound and the set value referred to by the setting device 41, and based on this difference, updates (corrects, changes) the set value of the pressure control device 33.

According to the device 60 for supplying a mixed gas of the present embodiment, similarly to the devices 40 and 50 for supplying a mixed gas described above, the mixed gas containing the hydrazine compound and ammonia can be safely and stably led out into the mixed gas lead-out passage L15.

Further, according to the device 60 for supplying a mixed gas of the present embodiment, the set value of the pressure control device 33 can be updated automatically such that the flow rate and the content ratio of the hydrazine compound calculated by the arithmetic device 17 are the set flow rate and content ratio. That is, when the calculated value of the flow rate of the hydrazine compound is insufficient for the set value, or when the flow rate of the hydrazine compound decreases as the supply of the mixed gas progresses, the vapor pressure of the hydrazine compound in the raw material container 11 is insufficient. Therefore, the opening of the on-off valve 32 is adjusted to be large so as to match the set values, and the mixed gas having the set value of the flow rate and content ratio can be supplied with good responsiveness. By automatically adjusting the opening of the on-off valve 32 (that is, the set value of the pressure control device 33), the mixed gas can be supplied more stably.

Seventh Embodiment

Figure 8:
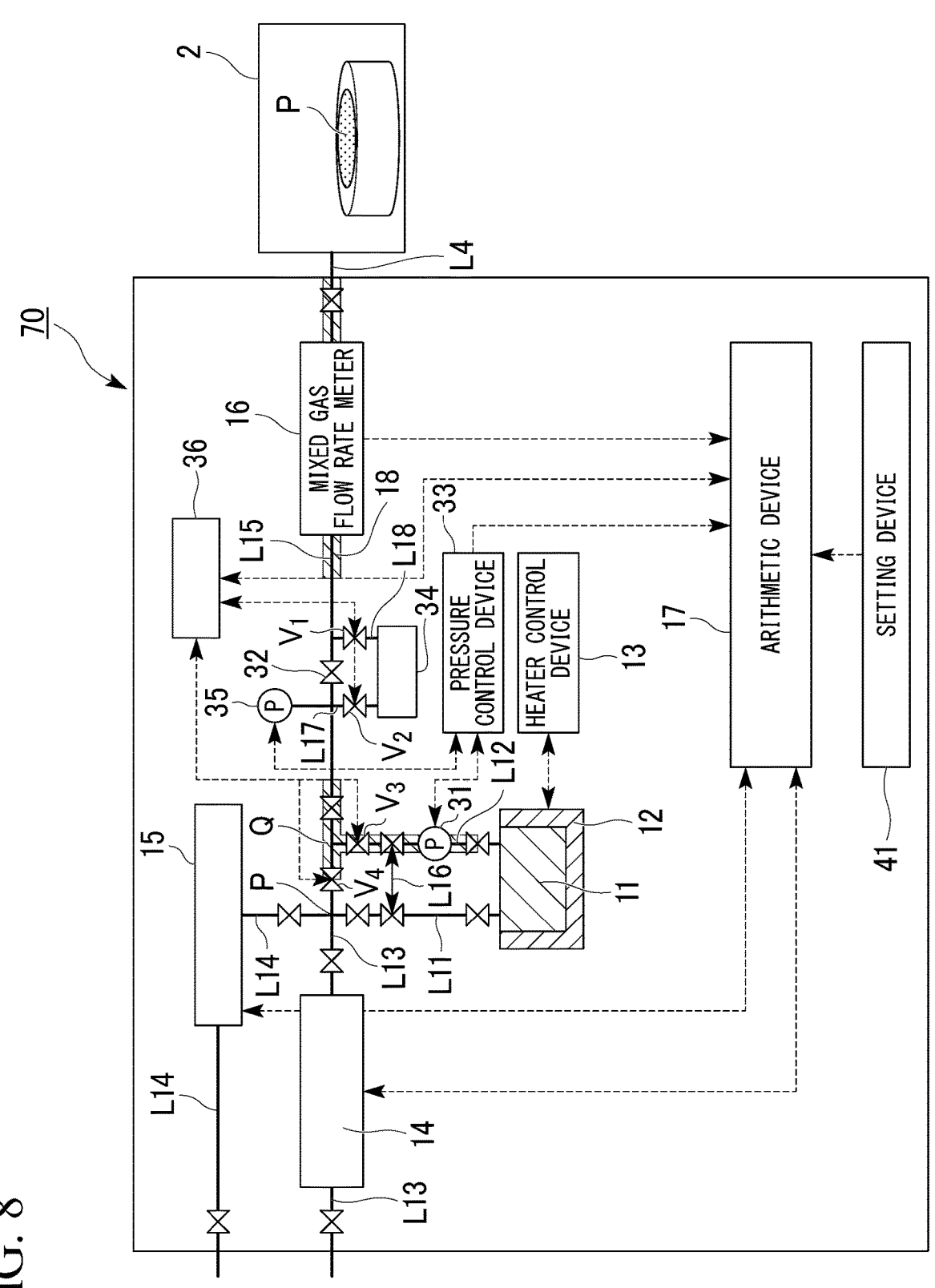
FIG. 8 is a system diagram schematically showing the configuration of a seventh embodiment of the device for supplying a mixed gas of the present invention.

FIG. 8 is a system diagram schematically showing the configuration of the seventh embodiment of the device for supplying a mixed gas of the present invention.

As shown in FIG. 8, the device 70 for supplying a mixed gas of the seventh embodiment has the same configuration as that of the device 60 for supplying a mixed gas of the sixth embodiment, except that the device 70 for supplying a mixed gas of the present embodiment further includes a buffer tank (storage tank) 34, a second pressure gauge 35, and a flow path selection device. Therefore, in the device 70 for supplying a mixed gas of the present embodiment, the same components as those of the device 60 for supplying a mixed gas are denoted by the same reference numerals, and descriptions thereof are omitted.

The buffer tank 34 is located in the mixed gas lead-out passage L15 and is a container that stores the mixed gas. Specifically, a mixed gas-branching passage L17 and a mixed gas-merging passage L18 are connected to the buffer tank 34, and the buffer tank 14 communicates with the mixed gas lead-out passage L15 via these passages L17 and L18. In other words, the buffer tank 34 is located between the mixed gas-branching passage L17 branched from the mixed gas lead-out passage L15 on the primary side of the on-off valve 32, and the mixed gas-merging passage L18 that merges with the mixed gas lead-out passage L15 on the secondary side of the on-off valve 32

Although the structure of the buffer tank 34 is not particularly limited, it is preferable to use a round buffer tank or a cylindrical buffer tank. Among these, a round buffer tank is preferable because of its good pressure resistance.

The material of the buffer tank 34 is not particularly limited, but can be selected from stainless steel such as SUS316L, SUS316, or SUS304, alloys such as Hastelloy, Inconel, or brass, metals such as nickel (Ni), chromium (Cr), molybdenum (Mo), titanium (Ti), aluminum (Al), tantalum (Ta), zirconium (Zr), magnesium (Mg), zinc (Zn), copper (Cu), and iron (Fe), quartz glass ($SiO_2$), silicon carbide (SiC), tungsten carbide (WC), alumina ($Al_2O_3$), carbon (C) and silicon (Si). Among these, stainless steel, Inconel, alumina, and quartz glass are preferably used, and stainless steel is more preferably used, because of their good corrosion resistance to the hydrazine compounds and ammonia.

The capacity of the buffer tank 34 is not particularly limited, but is 1 to 100 L. A capacity of 1 to 50 L is preferable from the viewpoint of ensuring the supply amount in a short filling time, and a capacity of 10 to 40 L is more preferable from the viewpoint of controlling the concentration of the mixed gas with high accuracy.

The second pressure gauge 35 is located in the mixed gas-branching passage L17 and measures the pressure in the buffer tank 34.

The flow path selection device has first to fourth on-off valves V1 to V4 and an on-off valve control device 36.

The first on-off valve V1 is located in the mixed gas-merging passage L18.

The second on-off valve V2 is located in the mixed gas-branching passage L17.

The third on-off valve V3 is located in the lead-out passage L12.

The fourth on-off valve V4 is located at the ammonia supply passage L14.

The opening of the first to fourth on-off valves V1 to V4 can be freely adjusted from fully closed (0% opening) to fully open (100% opening).

The on-off valve control device 36 can transmit and receive electrical signals to and from the first to fourth on-off valves V1 to V4 by wire or wirelessly. Specifically, the on-off valve control device 36 transmits control signals for adjusting the opening to each of the first to fourth on-off valves V1 to V4 based on the measured value of the pressure in the raw material container 11 and the buffer tank 34 which are received through the first pressure gauge 31, second pressure gauge 35, pressure control device 33, and arithmetic device 17.

The device 70 for supplying a mixed gas of the present embodiment includes the buffer tank 34 located in the mixed gas lead-out passage L15. Therefore, it is possible to temporarily store the mixed gas containing the hydrazine compound and ammonia of which the concentrations are adjusted. Further, according to the device 70 for supplying a mixed gas, it is possible to separately supply the hydrazine compound and ammonia into the buffer tank 34 to prepare a mixed gas with a required concentration in the buffer tank 34.

That is, according to the device 70 for supplying a mixed gas of the seventh embodiment, in a step of supplying the nitrogen-containing compound raw material into the processing chamber 2 in the method for producing a metal nitride film described later, a mixed gas having a required concentration can be stored in the buffer tank 34, and the mixed gas led out from the buffer tank 34 can be used as the nitrogen-containing compound raw material.

A method for preparing a mixed gas having a required concentration in the buffer tank 34 using the device 70 for supplying a mixed gas of the seventh embodiment will be described below.

First, the setting device 41 is used to set the concentration of the mixed gas containing ammonia and the hydrazine compound (mixed gas concentration setting step).

Next, an evacuation means (not shown in figures) is used to evacuate the buffer tank 34 of residual gas (evacuating step). At this time, the mixed gas lead-out passage L15 and other passages (pipes) can also be evacuated.

Next, the on-off valve control device 36 is used to close the fourth on-off valve V4 and the first on-off valve V1, and open the third on-off valve V3 and the second on-off valve V2. As a result, the buffer tank 34 is filled with a hydrazine compound gas having a low vapor pressure (hydrazine compound filling step).

Next, when it is confirmed that the pressure values in the raw material container 11 and the pressure value in the buffer tank 34 are the same (that is, the buffer tank 34 is filled with the hydrazine compound at about vapor pressure) using the first pressure gauge 31 and the second pressure gauge 35, the on-off valve control device 36 is used to close the third on-off valve V3 and open the fourth on-off valve V4. As a result, the ammonia gas is filled in the buffer tank 34 up to the set pressure of the mixed concentration of the ammonia/hydrazine compound (ammonia filling step).

Next, the on-off valve control device 36 is used to close the fourth on-off valve V4 and open the first on-off valve V1, and the mixed gas of ammonia/the hydrazine compound prepared to a required concentration (concentration is adjusted) is supplied into the processing chamber 2 (mixed gas of ammonia/the hydrazine compound supplying step).

According to the device 70 for supplying a mixed gas of the seventh embodiment, by these procedures, the mixed gas of ammonia/the hydrazine compound adjusted to the required concentration using the buffer tank 34 can be stably supplied into the processing chamber 2.

Here, the filling pressure of ammonia (ammonia partial pressure) in accordance with the set concentration of the mixed gas ammonia/hydrazine compound is calculated by the following formula (I).

$$C=B\times(100-A)/A \qquad \text{(I)}$$

A: concentration (%) of the hydrazine compound in the mixed gas of ammonia/the hydrazine compound B: pressure in raw material container (vapor pressure of the hydrazine compound)

C: required filling pressure of ammonia (ammonia partial pressure in the buffer tank 34)

B+C: total pressure in buffer tank 34 (filling pressure of mixed gas)

The above formula (I) is a formula calculated from B/(B+C)=A/100.

Hereinafter, a method for preparing a mixed gas with a required concentration in the buffer tank 34 using the device 70 for supplying a mixed gas of the seventh embodiment will be specifically described using an example.

(Case 1)

Using the setting device 41, the concentration of ammonia/the hydrazine compound is adjusted to: 90%/10%. Here, when the pressure in the raw material container 11 (that is, the vapor pressure of the hydrazine compound) is 4 kPa, the filling pressure of ammonia gas is 36 kPa, and the mixed gas having a total pressure of 40 kPa is produced in the buffer tank 34.

The mixed gas can also be produced by setting the total pressure of the mixed gas (filling pressure in the buffer tank 34) to a predetermined value. At this time, the filing pressure of ammonia (ammonia partial pressure) can be calculated by the following formula (II) in accordance with the concentration of the mixed gas of ammonia/the hydrazine compound.

$$(A/100) \times D = B$$

$$D - B = C \tag{II}$$

A: concentration (%) of the hydrazine compound in the mixed gas of ammonia/the hydrazine compound B: pressure in raw material container (vapor pressure of the hydrazine compound)

C: required filling pressure of ammonia (partial pressure of ammonia in the buffer tank 34)

D: B+C=total pressure in buffer tank 34 (filling pressure of mixed gas)

(Case 2)

Using the setting device 41, the concentration of ammonia/the hydrazine compound is adjusted to: 90%/10%. Here, when the pressure in the buffer tank 34 (that is, the filling pressure of the mixed gas) is set to 100 kPa, the filling pressure of the hydrazine compound is 10 kPa and the filing pressure of ammonia is 90 kPa, and a mixed gas having a total pressure of 100 kPa is produced in the buffer tank 34.

In this way, according to the method for Case 2, since the filling pressure of the mixed gas into the buffer tank 34 can be set in advance, a large flow rate of the mixed gas can be stably supplied into the processing chamber 2.

According to the method for Case 2, after the required filling pressure of the hydrazine compound is reached in the buffer tank 34 in the hydrazine compound filling step, the ammonia filling step is started. When it is found from the measured value of the first pressure gauge 31 that the vapor pressure of the hydrazine compound does not reach the required filling pressure, by heating the raw material container 11 of the hydrazine compound with the heater 12, the vapor pressure of the hydrazine compound can be increased. At this time, the heater control device 13 may be used to automatically heat the raw material container 11.

The filling pressure of the mixed gas into the buffer tank 34 is not particularly limited, but can be in the range of 1 to 1000 kPa. Among the above ranges, it is preferable to perform the production of the mixed gas in a range of 1 to 200 kPa, which allows the mixed gas to be produced in a short time and to increase the amount of mixed gas filled. From the viewpoint of concentration accuracy, it is more preferable to perform in the range of 1 to 100 kPa.

According to the device 70 for supplying a mixed gas of the seventh embodiment, the concentration of the mixed gas containing ammonia and the hydrazine compound can be adjusted using the pressure value. Therefore, the mixed gas of which the concentration is adjusted with high precision can be stably supplied into the processing chamber 2.

In addition, according to the device 70 for supplying a mixed gas, the mixed gas of which the concentration has been adjusted can be stored into the buffer tank 34. Therefore, even if the consumption of the mixed gas in the processing chamber 2 increases, the mixed gas can be stably supplied into the processing chamber 2.

Furthermore, the device 70 for supplying a mixed gas includes the buffer tank 34 located in the mixed gas lead-out passage L15. Therefore, even if the pressure of the raw material container 11 suddenly increases, the pressure of the raw material container 11 can be lowered to a safe range by discharging the hydrazine compound into the buffer tank 34. This allows the device 70 for supplying a mixed gas to operate more safely.

As described above, according to the device for supplying a mixed gas 10 to 70 of the first to seventh embodiments of the present invention, the mixed gas containing the hydrazine compound and ammonia can be safely and stably led out into the mixed gas lead-out passage L15.

Further, according to the devices for supplying a mixed gas 10 to 70 of the first to seventh embodiments, by controlling the temperature of the raw material container 11 or the pressure in the raw material container 11, the hydrazine compound can be supplied in a flow rate range of 1 to 5000 sccm, and the mixed gas containing ammonia and the hydrazine compound can be supplied in the range of 1 to 10,000 sccm.

In the film-forming device 1 of the embodiments above, when using the devices for supplying a mixed gas 10 to 70 of the first to seventh embodiments as the reaction gas supply source, from the viewpoint of the quality of the metal nitride film, the concentration of $H_2O$ contained in the nitrogen-containing compound raw material is preferably 0.1 ppm or less. Similarly, from the viewpoint of the quality of the metal nitride film, the concentration of $H_2O$ contained in the hydrazine compound is preferably 10 ppm or less, and more preferably 1 ppm or less.

When the nitrogen-containing compound raw material or the hydrazine compound has a high moisture concentration, the devices 10 to 60 for supplying a mixed gas may include a purifier containing an adsorbent, a separation membrane, or the like.

The device 40 for supplying a mixed gas of the fourth embodiment described above requires time for heating the raw material container 11 and stabilizing the vapor pressure of the hydrazine compound. Therefore, there is a concern about responsiveness. However, since the vapor pressure of the hydrazine compound can be controlled in accordance with the set values of the flow rate and the content ratio of the hydrazine compound, the mixed gas of ammonia and the hydrazine compound can be supplied with high accuracy.

In contrast, the temperature of the raw material container 11 is constant in the devices 50 and 60 for supplying a mixed gas of the fifth and sixth embodiments. Therefore, when the vapor pressure of the hydrazine compound is insufficient, or when the pressure of the subsequent processing chamber 2 fluctuates (calculated values for the hydrazine compound flow rate and content ratio may not reach the set values), the flow rate of the dilution gas and ammonia, or the pressure value in the raw material container 11 can be controlled with good responsiveness by adjusting the opening of the on-off valve 32.

The configurations of the devices 10 to 70 for supplying a mixed gas of the first to seventh embodiments described above are merely examples, and are not limited to these embodiments. For example, the dilution gas supply passage L13 of the device 10 for supplying a mixed gas may be connected to either one of the proximal end P of the introduction passage L11 and the distal end of the lead-out passage L12 (that is, the proximal end of the mixed gas lead-out passage L15) Q.

In addition, the device 20 for supplying a mixed gas of the second embodiment may include the first pressure gauge 31, the on-off valve 32, and the pressure control device 33, similar to the third embodiment described above.

In addition, the devices 40 to 60 for supplying a mixed gas of the fourth to sixth embodiments described above have been described as an example in which the arithmetic devices 17 each have different functions. However, the present invention is not limited to these embodiments, and arithmetic devices 17 may have any two functions or all functions.

The device 40 for supplying a mixed gas of the fourth embodiment described above has the interlock mechanism, but other devices for supplying a mixed gas may have the interlock mechanism.

Moreover, the device 70 for supplying a mixed gas of the seventh embodiment described above includes one buffer tank 34, but the present invention is not limited to this embodiment, and may include two or more buffer tanks 34 in parallel. If the device for supplying a mixed gas includes two or more buffer tanks 34, while supplying mixed gas into the processing chamber 2 from any one buffer tank, the mixed gas with a required concentration can be prepared (produced) in other buffer tanks. By alternately supplying and producing the mixed gas using two or more buffer tanks 34 in this way, the mixed gas of ammonia/the hydrazine compound can be continuously supplied into the processing chamber 2.

Further, in the device 70 for supplying a mixed gas of the seventh embodiment described above, a gas concentration-measuring device for measuring the gas concentration in the buffer tank 34 may be used instead of the mixed gas flow meter 16.

In addition, in the devices 10 to 70 for supplying a mixed gas of the first to seventh embodiments described above, one or more of an inert gas such as helium (He), nitrogen ($N_2$), and argon (Ar), hydrogen ($H_2$) and the like may be included in the mixed gas containing the hydrazine compound and ammonia.

<Method for Producing a Metal Nitride Film>

The method for producing a metal nitride film of the present invention is a method in which a metal nitride film is formed on at least a part of the surface of a substrate to be processed by chemical vapor deposition using a metal compound raw material and a nitrogen-containing compound raw material.

The chemical vapor deposition method is not particularly limited, but examples of the chemical vapor deposition method include CVD, plasma CVD, MOCVD, ALD, and plasma ALD. Among these, CVD and ALD are preferable, and ALD is more preferable.

The method for producing a metal nitride film of the present invention can be performed using the film-forming device 1 described above.

In addition, the method for producing a metal nitride film of the present invention uses any of the devices 10 to 70 for supplying a mixed gas of the first to seventh embodiments described above, and the mixed gas containing hydrazine and ammonia as the nitrogen-containing compound raw material.

The content ratio of hydrazine and ammonia in the mixed gas is 1:99 to 50:50 in volumetric flow ratio. From the viewpoint of further reducing the amount of hydrazine used, the content ratio of hydrazine and ammonia in mixed gas is preferably 1:99 to 10:90. If the content ratio of hydrazine is 1% by volume or more in the total of 100% by volume of hydrazine and ammonia, the effect of lowering the film formation temperature of a metal nitride film can be obtained. Further, when the content ratio of hydrazine is 50% or less, the amount of hydrazine, which is relatively expensive, is reduced, and the cost can be reduced, thereby improving productivity.

As the method for producing a silicon-containing thin film using the film-forming device 1 described above, the following methods 1 to 7 will be specifically described with reference to the drawings.

(Method 1)

First, as a preparation step, a substrate (substrate to be processed) P is placed in the processing chamber 2, and the surface temperature of the substrate P is controlled to a required temperature.

Next, a film-forming process including the following steps is performed.

Step 1A: A raw material gas containing a metal compound raw material is supplied to the substrate P in the processing chamber 2.

Step 1B: A reaction gas containing a nitrogen-containing compound raw material is supplied to the substrate P in the processing chamber 2.

In Step 1A, one or more selected from the group consisting of the metal compound raw materials described above is used.

The raw material gas may contain the carrier gas above as a coexistent gas in addition to the metal compound raw material.

In Step 1B, the mixed gas containing hydrazine and ammonia is used as a nitrogen-containing compound raw material (a step of supplying a nitrogen-containing compound raw material).

The mixed gas is supplied using any one of the devices 10 to 70 for supplying a mixed gas of the first to seventh embodiments described above. In addition, the reaction gas may contain the carrier gas above as a coexistent gas in addition to the mixed gas.

In Method 1, Steps 1A and 1B are performed until the film thickness of the thin film on the substrate P reaches a desired thickness.

Step 1A and step 1B may be performed simultaneously (CVD method) or alternately (ALD method).

(Method 2)

Figure 9:
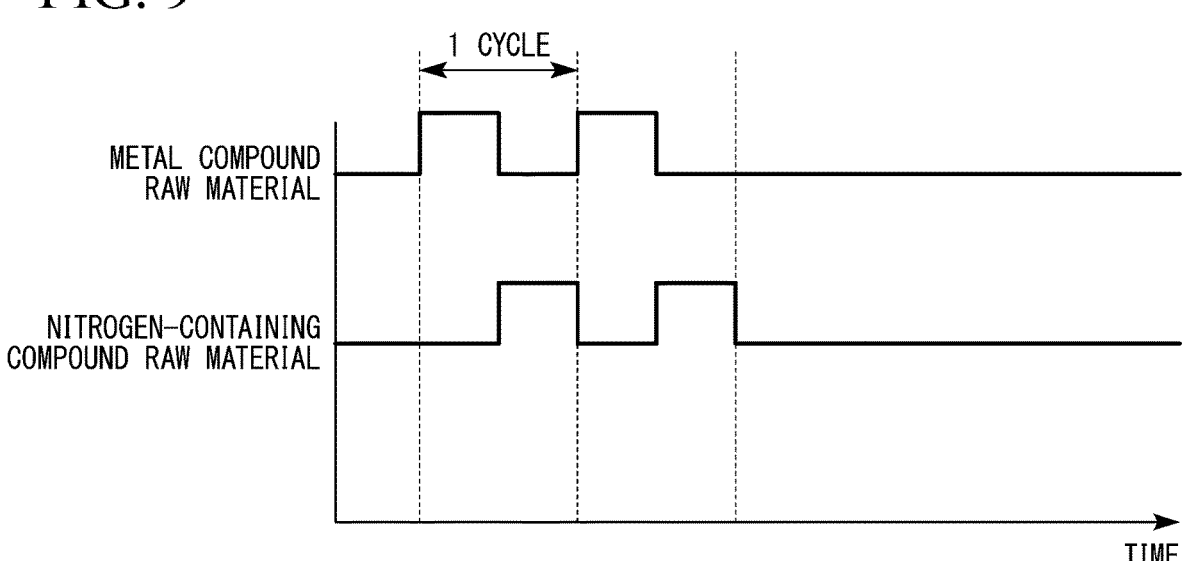
FIG. 9 is a timing chart showing an example of a film-forming process in the method for producing a metal nitride film of the present invention

Method 2 is a method for producing a metal nitride film (film formation method) by the ALD method. FIG. 9 is a timing chart showing an example of a film-forming process in the method for producing a metal nitride film of the present invention.

First, as in the preparation step in Method 1, the surface temperature of the substrate P transported into the processing chamber 2 is controlled to a required temperature.

Next, a film-forming process including the following steps is performed (see FIG. 9).

Step 2A: A raw material gas containing a metal compound raw material is supplied to the substrate P in the processing chamber 2.

Step 2B: The supply of raw material gas is stopped.

Step 2C: A reaction gas containing a nitrogen-containing compound raw material is supplied to the substrate P in the processing chamber 2 (a step of supplying a nitrogen-containing compound raw material).

Step 2D: The supply of the reaction gas is stopped.

In Step 2A, the raw material gas is supplied to the substrate P in the processing chamber 2 under vacuum. As the raw material gas, the raw material gas shown in step 1A of Method 1 above can be used. As a result, a chemisorption reaction occurs between the surface of the substrate P and the metal compound raw material.

In step 2B, the supply of raw material gas is stopped after the chemisorption reaction described above.

In Step 2C, a reaction gas is supplied to the substrate P in the processing chamber 2 under vacuum. As the reaction gas, the reaction gas shown in Step 1B of Method 1 described above can be used. As a result, the metal compound raw material adsorbed on the surface of the substrate P in step 2A is nitrided.

In Step 2D, the supply of the reaction gas is stopped after the nitriding reaction of the metal compound raw material described above.

In the film formation process, a step of supplying only the inert gas into the processing chamber 2 after the Step 2B of stopping the supply of the metal compound raw material, or after the Step 2D of stopping the supply of the nitrogen-containing compound raw material may be included Otherwise, a step of supplying only the inert gas into the processing chamber 2 after the Step 2B of stopping the supply of the metal compound raw material and the Step 2D of stopping the supply of the nitrogen-containing compound raw material may be included.

Further, a step of evacuating in the processing chamber 2 without supplying an inert gas may be included.

Also, a step in which a step of supplying only an inert gas and a step of evacuating are continuously performed may be included.

Furthermore, a step of supplying ammonia or ammonia diluted with an inert gas into the processing chamber 2 may be further included.

In Method 2, a metal nitride film having a desired thickness can be produced (deposited) on the substrate P by repeating the cycle a plurality of times (for example, 500 cycles).

In Method 2, the Steps 2A to 2D are performed in this order in the cycle described above, but the next step may be started after the previous step is completed, or the next step may be started before the previous step is completed. Alternatively, the Steps 2B and 2D may be omitted. Thus, by overlapping some steps or omitting some steps, the time per cycle can be shortened. Furthermore, the film formation rate can be controlled to a desired speed.

(Method 3)

Figure 10:
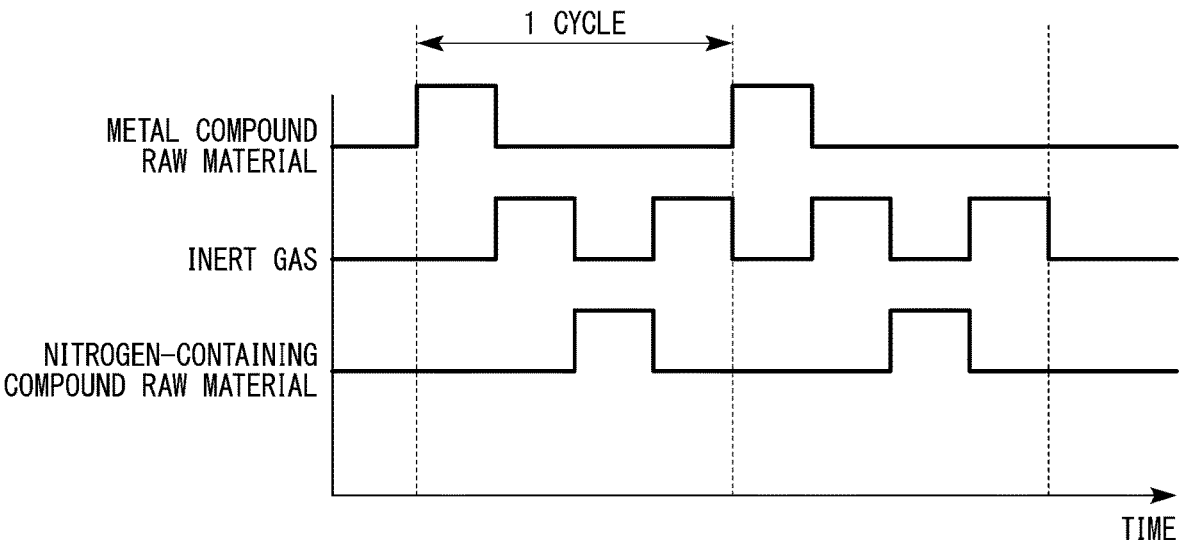
FIG. 10 is a timing chart showing an example of a film-forming process in the method for producing a metal nitride film of the present invention

FIG. 10 is a timing chart showing an example of a film-forming process in the method for producing a metal nitride film of the present invention.

First, as in the preparation step in Method 1, the surface temperature of the substrate P transported into the processing chamber 2 is controlled to a required temperature.

Next, a film-forming process including the following steps is performed a plurality of times (see FIG. 10).

Step 3A: A raw material gas containing a metal compound raw material is supplied to the substrate P in the processing chamber 2.

Step 3B: The supply of raw material gas is stopped, and an inert gas is supplied into the processing chamber 2.

Step 3C: The supply of the inert gas is stopped, and a reaction gas containing a nitrogen-containing compound raw material is supplied to the substrate P in the processing chamber 2 (a step of supplying a nitrogen-containing compound raw material).

Step 3D: The supply of the reaction gas is stopped, and the inert gas is supplied into the processing chamber 2.

Step 3E: The supply of the inert gas is stopped.

In Step 3A, the raw material gas is supplied to the substrate P in the processing chamber 2 under vacuum. As the raw material gas, the raw material gas shown in step 1A of Method 1 above can be used. As a result, a chemisorption reaction occurs between the surface of the substrate P and the metal compound raw material.

In Step 3B, after the chemisorption reaction described above, the supply of the raw material gas is stopped, and an inert gas is supplied to remove the unreacted metal compound raw material remaining in the processing chamber 2, thereby purging the inside of the processing chamber 2.

In Step 3C, the supply of the inert gas is stopped, and the reaction gas is supplied to the substrate P in the processing chamber 2 under vacuum. As the reaction gas, the mixed gas containing hydrazine and ammonia used in step 1B of Method 1 described above can be used. As a result, the metal compound raw material adsorbed on the surface of the substrate P in step 3A is nitrided.

In Step 3D, after the nitridation reaction of the metal compound raw material described above, the supply of the reaction gas is stopped, and the inert gas is supplied to remove the unreacted nitrogen-containing compound raw material remaining in the processing chamber 2, and the inside of the processing chamber 2 is purged.

In Step 3E, the supply of the inert gas is stopped.

In Method 3, a step of evacuating the processing chamber 2 without supplying an inert gas may be included, a step of supplying only the inert gas and the step of evacuating the processing chamber 2 may be performed continuously, or a step of supplying ammonia or ammonia diluted with an inert gas may be included.

(Method 4)

Figure 11:
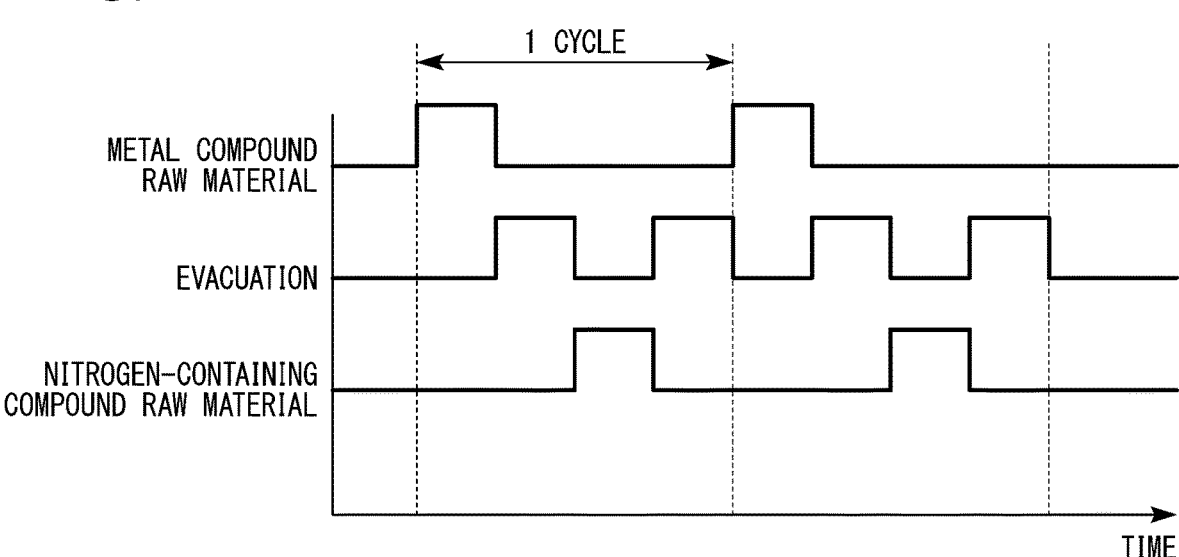
FIG. 11 is a timing chart showing an example of a film-forming process in the method for producing a metal nitride film of the present invention

FIG. 11 is a timing chart showing an example of a film-forming process in the method for producing a metal nitride film of the present invention.

First, as in the preparation step in Method 1, the surface temperature of the substrate P transported into the processing chamber 2 is controlled to a required temperature.

Next, a film-forming process including the following steps is performed a plurality of times (see FIG. 11).

Step 4A: A raw material gas containing a metal compound raw material is supplied to the substrate P in the processing chamber 2.

Step 4B: The supply of raw material gas is stopped, and the inside of the processing chamber 2 is evacuated.

Step 4C: The evacuation of the processing chamber 2 is stopped, and a reaction gas containing a nitrogen-containing compound raw material is supplied to the substrate P in the processing chamber 2 (a step of supplying a nitrogen-containing compound raw material).

Step 4D: The supply of the reaction gas is stopped, and the inside of the processing chamber 2 is evacuated.

Step 4E: The evacuation of the processing chamber 2 is stopped.

In Step 4A, the raw material gas is supplied to the substrate P in the processing chamber 2 under vacuum. As the raw material gas, the raw material gas shown in step 1A of Method 1 above can be used. As a result, a chemisorption reaction occurs between the surface of the substrate P and the metal compound raw material.

In Step 4B, after the chemisorption reaction described above, the supply of the raw material gas is stopped, and the inside of the processing chamber 2 is evacuated to remove the unreacted metal compound raw material remaining in the processing chamber 2.

In Step 4C, the evacuation of the processing chamber 2 is stopped, and the reaction gas is supplied to the substrate P in the processing chamber 2 under vacuum. As the reaction gas, the mixed gas containing hydrazine and ammonia used in step 1B of Method 1 above can be used. As a result, the metal compound raw material adsorbed on the surface of the substrate in step 4A is nitrided.

In step 4D, after the nitridation reaction of the metal compound raw material described above, the supply of the reaction gas is stopped, and the inside of the processing chamber 2 is evacuated in order to remove the unreacted nitrogen-containing compounds remaining in the processing chamber 2.

In Step 4E, the evacuation of the processing chamber 2 is stopped.

In Method 4, a step of supplying only the inert gas may be included, a step of supplying only the inert gas and the step of evacuating the processing chamber 2 may be performed continuously, or a step of supplying ammonia or ammonia diluted with an inert gas may be included.
(Method 5)

Figure 12:
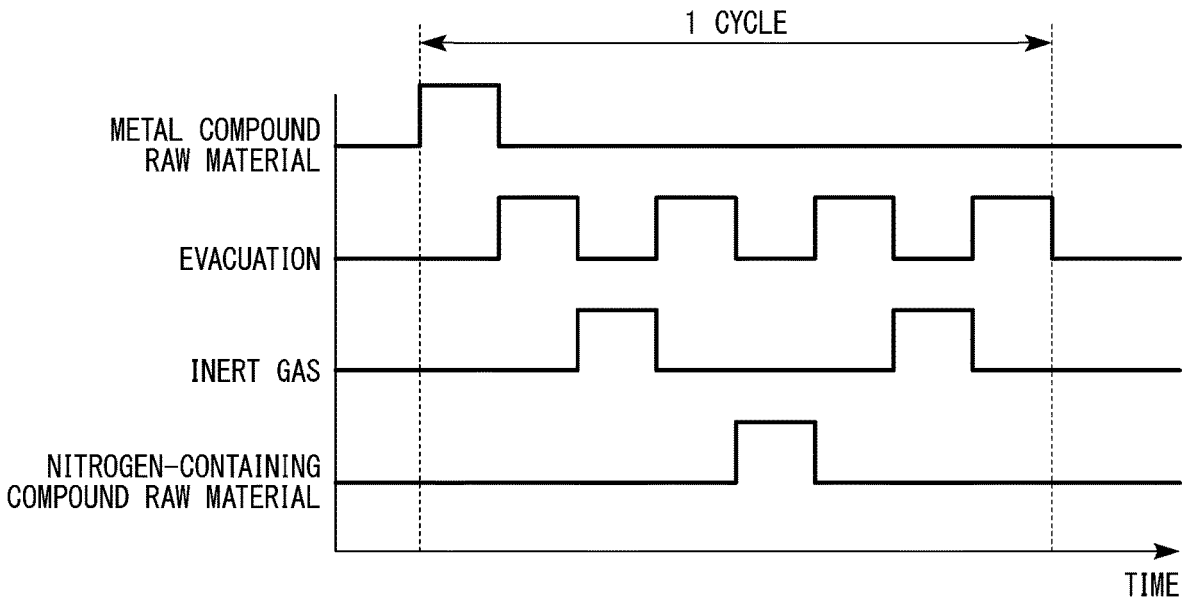
FIG. 12 is a timing chart showing an example of a film-forming process in the method for producing a metal nitride film of the present invention

FIG. 12 is a timing chart showing an example of a film-forming process in the method for producing a metal nitride film of the present invention.

First, as in the preparation step in Method 1, the surface temperature of the substrate P transported into the processing chamber 2 is controlled to a required temperature.

Next, a film-forming process including the following steps is performed a plurality of times (see FIG. 12).

Step 5A: A raw material gas containing a metal compound raw material is supplied to the substrate P in the processing chamber 2.

Step 5B: The supply of raw material gas is stopped, and the inside of the processing chamber 2 is evacuated.

Step 5C: The evacuation of the processing chamber 2 is stopped, and an inert gas is supplied into the processing chamber 2.

Step 5D: The supply of the inert gas is stopped, and the inside of the processing chamber is evacuated.

Step 5E: The evacuation of the processing chamber 2 is stopped, and a reaction gas containing a nitrogen-containing compound raw material is supplied to the substrate P in the processing chamber 2 (a step of supplying a nitrogen-containing compound raw material).

Step 5F: The supply of the reaction gas is stopped, and the inside of the processing chamber 2 is evacuated.

Step 5G: The evacuation of the processing chamber 2 is stopped, and an inert gas is supplied into the processing chamber 2.

Step 5H: The supply of the inert gas is stopped, and the inside of the processing chamber 2 is evacuated.

Step 5I: The evacuation of the processing chamber is stopped.

In Step 5A, the raw material gas is supplied to the substrate P in the processing chamber 2 under vacuum. As the raw material gas, the raw material gas shown in step 1A of Method 1 above can be used. As a result, a chemisorption reaction occurs between the surface of the substrate P and the metal compound raw material.

In Step 5B, after the nitridation reaction of the metal compound raw material described above, the supply of the raw material gas is stopped, and the inside of the processing chamber 2 is evacuated to remove the unreacted metal compound raw material remaining in the processing chamber 2.

In Step 5C, the evacuation of the processing chamber 2 is stopped, and the inert gas is supplied into the processing chamber 2 to purge the inside of the processing chamber 2.

In Step 5D, the supply of the inert gas is stopped, and the inside of the processing chamber 2 is evacuated to remove the inert gas remaining in the processing chamber 2.

In Step 5E, the evacuation of the processing chamber 2 is stopped, and the reaction gas is supplied to the substrate P in the processing chamber 2 under vacuum. As the reaction gas, the mixed gas containing hydrazine and ammonia can be used. As a result, the metal compound raw material adsorbed on the surface of the substrate in step 5A is nitrided.

In step 5F, after the nitridation reaction of the metal compound raw material described above, the supply of the reaction gas is stopped, and the inside of the processing chamber 2 is evacuated in order to remove the unreacted nitrogen-containing compounds remaining in the processing chamber 2.

In Step 5G, the evacuation of the processing chamber 2 is stopped, and an inert gas is supplied into the processing chamber 2 to purge the inside of the processing chamber 2.

In Step 5H, the supply of the inert gas is stopped, and the inside of the processing chamber 2 is evacuated to remove the inert gas remaining in the processing chamber 2.

In Step 5I, the evacuation of the processing chamber 2 is stopped.

In Method 5, a step of supplying ammonia or ammonia diluted with an inert gas may be included.
(Method 6)

Figure 13:
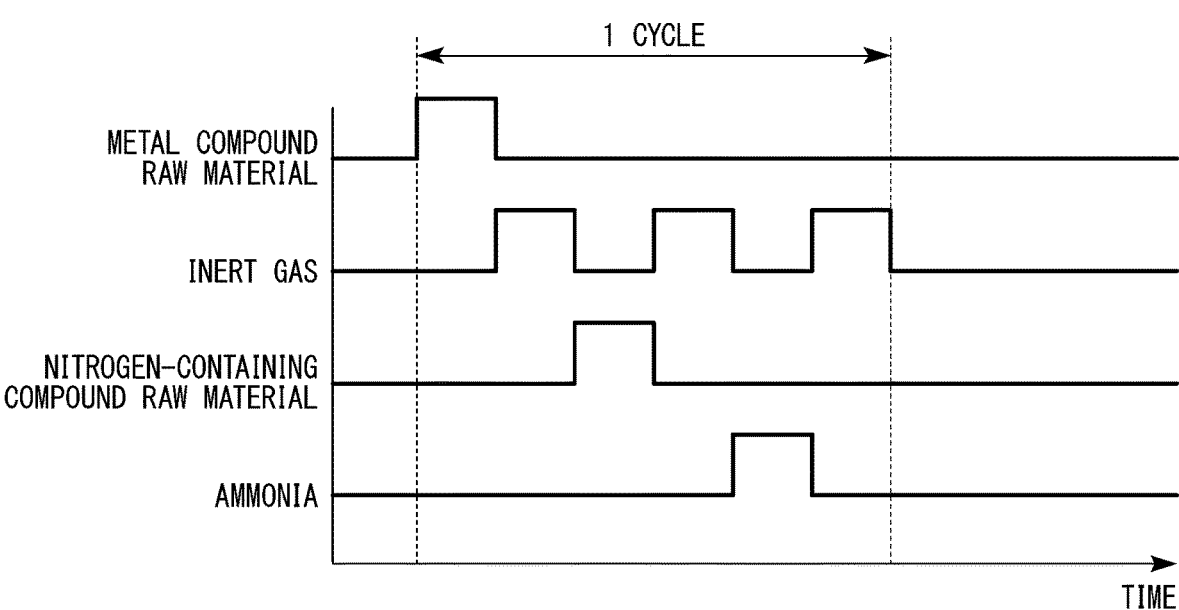
FIG. 13 is a timing chart showing an example of a film-forming process in the method for producing a metal nitride film of the present invention

FIG. 13 is a timing chart showing an example of a film-forming process in the method for producing a metal nitride film of the present invention.

First, as in the preparation step in Method 1, the surface temperature of the substrate P transported into the processing chamber 2 is controlled to a required temperature.

Next, a film-forming process including the following steps is performed a plurality of times (see FIG. 13).

Step 6A: A raw material gas containing a metal compound raw material is supplied to the substrate P in the processing chamber 2.

Step 6B: The supply of raw material gas is stopped, and an inert gas is supplied into the processing chamber 2.

Step 6C: The supply of the inert gas is stopped, and a first reaction gas containing a nitrogen-containing compound raw material is supplied to the substrate P in the processing chamber 2 (a step of supplying a nitrogen-containing compound raw material).

Step 6D: The supply of the first reaction gas is stopped, and an inert gas is supplied into the processing chamber 2.

Step 6E: The supply of the inert gas is stopped, and a second reaction gas containing ammonia is supplied to the substrate P in the processing chamber 2.

Step 6F: The supply of the second reaction gas is stopped, and an inert gas is supplied into the processing chamber 2.

Step 6G: The supply of the inert gas is stopped.

In Step 6A, the raw material gas is supplied to the substrate P in the processing chamber 2 under vacuum. As the raw material gas, the raw material gas shown in step 1A of Method 1 above can be used.

In Step 6B, the supply of the raw material gas is stopped, and the inert gas is supplied into the processing chamber 2 to purge and remove the unreacted metal compound raw material remaining in the processing chamber 2.

In Step 6C, the supply of the inert gas is stopped, and the first reaction gas is supplied to the substrate P in the processing chamber 2. As the first reaction gas, the mixed gas containing hydrazine and ammonia can be used.

In Step 6D, the supply of the first reaction gas is stopped, and an inert gas is supplied into the processing chamber 2 to remove the first reaction gas remaining in the processing chamber 2.

In Step 6E, the supply of the inert gas is stopped, and the second reaction gas containing ammonia is supplied.

In Step 6F, the supply of the second reaction gas is stopped, and an inert gas is supplied into the processing chamber 2 to purge and remove the unreacted second reaction gas remaining in the processing chamber 2.

In Step 6G, the supply of the inert gas is stopped.

As the second reaction gas, ammonia or ammonia diluted with one or more inert gases can be used.

In Method 6, a step of evacuating the inside of the processing chamber 2 without supplying gas may be included, or a step of supplying only the inert gas and the step of evacuating may be performed continuously.
(Method 7)

Figure 14:
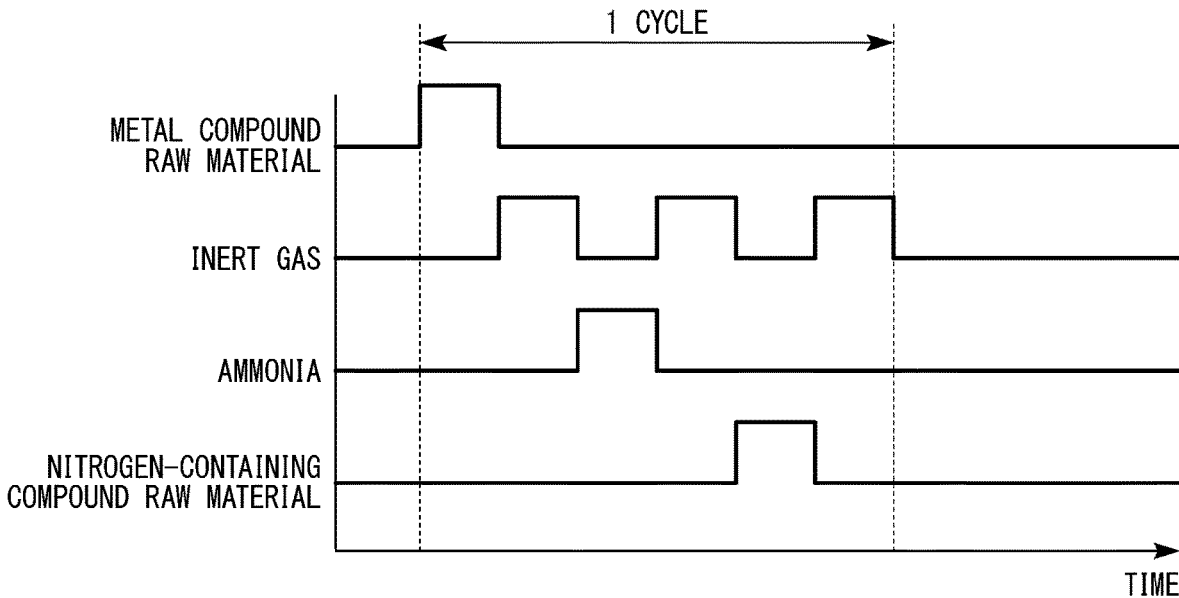
FIG. 14 is a timing chart showing an example of a film-forming process in the method for producing a metal nitride film of the present invention

FIG. 14 is a timing chart showing an example of a film-forming process in the method for producing a metal nitride film of the present invention.

First, as in the preparation step in Method 1, the surface temperature of the substrate P transported into the processing chamber 2 is controlled to a required temperature.

Next, a film-forming process including the following steps is performed a plurality of times (see FIG. 14).

Step 7A: A raw material gas containing a metal compound raw material is supplied to the substrate P in the processing chamber 2.

Step 7B: The supply of raw material gas is stopped, and an inert gas is supplied into the processing chamber 2.

Step 7C: The supply of the inert gas is stopped, and a first reaction gas containing ammonia is supplied to the substrate P in the processing chamber 2.

Step 7D: The supply of the first reaction gas is stopped, and an inert gas is supplied into the processing chamber 2.

Step 7E: The supply of the inert gas is stopped, and a second reaction gas containing a nitrogen-containing compound raw material is supplied to the substrate P in the processing chamber 2 (a step of supplying a nitrogen-containing compound raw material).

Step 7F: The supply of the second reaction gas is stopped, and an inert gas is supplied into the processing chamber 2.

Step 7G: The supply of the inert gas is stopped.

In Step 7A, the raw material gas is supplied to the substrate P in the processing chamber 2 under vacuum. As the raw material gas, the raw material gas shown in step 1A of Method 1 above can be used.

In Step 7B, the supply of the raw material gas is stopped, and the inert gas is supplied into the processing chamber 2 to purge and remove the unreacted metal compound raw material remaining in the processing chamber 2.

In Step 7C, the supply of the inert gas is stopped, and the first reaction gas is supplied to the substrate P in the processing chamber 2 under vacuum. As the first reaction gas, the mixed gas containing ammonia can be used.

In Step 7D, the supply of the first reaction gas is stopped, and an inert gas is supplied into the processing chamber 2 to purge and remove the unreacted first reaction gas remaining in the processing chamber 2.

In Step 7E, the supply of the inert gas is stopped, and the second reaction gas containing ammonia is supplied under vacuum. As the second reaction gas, the mixed gas containing hydrazine and ammonia can be used.

In Step 7F, the supply of the second reaction gas is stopped, and an inert gas is supplied into the processing chamber 2 to purge and remove the unreacted second reaction gas remaining in the processing chamber 2.

In Step 6G, the supply of the inert gas is stopped.

As the second reaction gas, ammonia or ammonia diluted with one or more inert gases can be used.

In Method 7, a step of evacuating the inside of the processing chamber 2 without supplying inert gas may be included, or a step of supplying only the inert gas and the step of evacuating may be performed continuously.

According to the method for producing a metal nitride film of the present invention, the following effects can be obtained because the mixed gas containing hydrazine and ammonia is used instead of only ammonia and only hydrazine as the reaction gas.

(1) Hydrazine is more reactive than ammonia. Therefore, if the amount of hydrazine is 1% by volume or more with respect to the total 100% by volume of hydrazine and ammonia in the mixed gas, the effect of lowering the film formation temperature of a metal nitride film can be obtained.

(2) Since hydrazine has a higher reducing property than ammonia, it can reduce the amount of chlorine, which is an impurity, in the film. Chlorine in the film not only degrades electrical resistance, but hydrogen chloride (HCl) generated by reaction with hydrogen (H) in the film damages the substrate. In particular, when the film formation temperature is lowered, the amount of chlorine in the film tends to increase.

(3) Hydrazine is more reactive than ammonia. Therefore, if the amount of hydrazine is 1% by volume or more with respect to the total 100% by volume of hydrazine and ammonia in the mixed gas, the effect of improving a film formation rate of a metal nitride film can be obtained, and the productivity is improved.

Also according to the method for producing a metal nitride film of the present invention, the cycle of the film formation process includes a step of evacuation. Therefore, residual gases such as a raw material gas, reaction gas, and inert gas in the processing chamber can be efficiently removed. In Method 4 described above, the residual gas can be efficiently removed because the film formation cycle includes the step of evacuation. Therefore, a metal nitride film with good coverage characteristics can be produced. In addition, Method 5 described above has the step of evacuating before and after supplying each of the raw material gas, the reaction gas, and the inert gas, so that the purge efficiency is improved more than that of Method 4.

In addition, according to the method for producing a metal nitride film of the present invention, as shown in Methods 6 and 7, thin films are formed by modifying the structure of the substrate surface by film formation through a three or more-step reaction. Therefore, it may be possible to produce a metal nitride film of better quality than a general film produced by a two-step reaction. Specifically, a dense metal nitride film is produced by supplying the mixed gas containing hydrazine and ammonia to the non-nitrided substrate surface sites in the ammonia-nitrided surface structure formed by supplying ammonia to nitride. In particular, when the ammonium nitrided surface structure and the hydrazine nitrided surface structure are adjacent to each other, the subsequent chemisorption reaction of the metal compound raw material (for example, $TiCl_4$) has the effect of lowering the activation energy because the reaction proceeds with little steric hindrance.

According to the method for producing a metal nitride film of the present invention, since the devices 10 to 70 for supplying a mixed gas of the first to seventh embodiments described above are used, a mixed gas containing 0.1 ppm or less of $H_2O$ contained in the nitrogen-containing compound raw material can be supplied as the reaction gas. As a result, impurities (oxygen components) derived from $H_2O$ are less likely to be mixed into the metal nitride film, so that a metal nitride film having excellent film properties such as electrical properties and resistance to hydrofluoric acid can be obtained.

According to the method for producing a metal nitride film of the present invention, since hydrazine is used as the nitrogen-containing compound, carbon atoms (C), halogen atoms such as chlorine atoms (Cl), and oxygen atoms (O) that are derived from the nitrogen-containing compound are hardly mixed into the metal nitride film, so that a metal nitride film having excellent film quality can be obtained.

Methods 1 to 7 described above are examples of the method for producing a metal nitride film of the present invention, and are not limited thereto. For example, in addition to Methods 1 to 7, various methods may be used to supply the metal compound raw material and the nitrogen-containing compound raw material.

<Evaluation Method for a Metal Nitride Film>

A metal nitride thin film obtained by the method for producing a metal nitride film of the present invention can be evaluated for film quality, film formation amount, and film density by the following methods.

(Evaluation of Film Quality)

The film quality of the thin film can be evaluated from the measured values of the film thickness and refractive index using a commercially available spectroscopic ellipsometer (for example, a spectroscopic ellipsometer manufactured by SOPRA).

For example, if a metal nitride film is a titanium nitride film, a titanium nitride film with a refractive index of less than 1.80 can generally be evaluated as a good quality titanium nitride film. In addition, a smaller refractive index means a denser titanium nitride film with fewer impurities.

On the other hand, when the refractive index is 1.80 or more, particularly when the refractive index exceeds 1.9, this means that 30% or more of the oxygen component is contained in the film. This means that the film is a titanium oxide film or a titanium oxynitride film.

In addition, when a metal nitride film is a silicon nitride film, it can generally be evaluated as a silicon nitride film having good quality when the refractive index is within the range of 1.8 to 2.1.

On the other hand, when the refractive index is less than 1.8, the silicon nitride film can be evaluated as having a rough film structure. It is to be noted that the smaller the refractive index, the more oxygen components are contained in the film.

In addition, when the refractive index is 1.6 or less, this generally means that the film is a silicon oxide film or a silicon oxynitride film.

When the refractive index exceeds 1.8, the film may contain a carbon component, and the larger the carbon component content, the larger the refractive index tends to be.

(Film Formation Amount)

From the obtained film thickness, GPC (Growth per cycle), which is the amount of film formed per cycle, can be calculated.

(Electrical Resistivity)

The electrical resistivity of the thin film is measured by the four-probe method at room temperature using a commercially available low resistivity meter (for example, Loresta GP manufactured by Mitsubishi Chemical Analytic Tech). A TFP probe (probe interval: 1 mm) can be used as the electrode probe.

The electrical resistivity is calculated from the obtained resistance value and the film thickness of the sample. For example, in the case of a titanium nitride film, it can be evaluated that the lower the electrical resistivity, the better the film quality. On the other hand, the higher the electrical resistivity, the more impurities such as oxygen, chlorine, and carbon are contained in the film, which can be evaluated as poor film quality.

(Amount of Impurities in Film)

The amount of impurities in the thin film can be evaluated by secondary ion mass spectrometry (SIMS) for chlorine, oxygen, and carbon content in the film. As the device, for example, "PHI ADEPT-1010" manufactured by ULVAC-PHI can be used.

(Hydrofluoric Acid Resistance)

The hydrofluoric acid resistance of the silicon nitride film can be evaluated by the hydrofluoric acid etching rate.

The hydrofluoric acid etching rate was measured by immersing a sample of the silicon-containing thin film in a hydrofluoric acid solution diluted with a ratio of hydrogen fluoride (HF):water=1:100, and after a predetermined period of time, quickly washing the thin film with pure water, then drying the thin film by blowing nitrogen gas or the like, and calculating from changes per unit time in the film thickness before and after immersion in hydrofluoric acid.

As explained above, according to the device for supplying a mixed gas of the present invention, the mixed gas contains a hydrazine compound and ammonia, and a large amount of hydrazine compound is not used. Therefore, a mixed gas containing a nitrogen-containing compound raw material useful as a reaction gas for forming a nitride film can be supplied safely and stably.

In addition, according to the device for supplying a mixed gas of the present invention, the flow rate of the hydrazine gas of the present invention, the flow rate of the hydrazine compound in the mixed gas and the mixing ratio of the hydrazine compound with ammonia can be controlled safely and stably, so handling is easy.

Also, the device for producing a metal nitride film and the method for producing a metal nitride film of the present invention use the mixed gas containing hydrazine and ammonia as the reaction gas. Therefore, a metal nitride film with good film quality can be obtained and the film formation rate, that is, the productivity, can be improved as compared with the case in which ammonia alone is used as the reaction gas.

Furthermore, according to the device for producing a metal nitride film and the method for producing a metal nitride film of the present invention, the mixed gas containing hydrazine and ammonia is used as the reaction gas, and material costs can be significantly reduced as compared with the case in which hydrazine alone is used as the reaction gas.

The technical scope of the present invention is not limited to the embodiments above, and various modifications can be made without departing from the gist of the present invention. For example, the film-forming device 1 of the embodiment above includes one raw material gas supply passage L3 and one reaction gas supply passage L4, but is not limited to this embodiment. The raw material gas supply passage L3 may have a plurality of passages or branch passages in order to supply a plurality of types of metal compound raw materials into the processing chamber 2. In addition, the reaction gas supply passage L4 may have a plurality of passages or branch passages in order to supply a plurality of types of nitrogen-containing compound raw materials into the processing chamber 2.

EXAMPLES

The present invention will be described in more detail using examples below, but the present invention is not limited to these examples.

The metal nitride films of Examples 1 to 7 and Comparative Examples 1 to 8 were formed using the film-forming device 1 shown in FIG. 1 under the following conditions.

Film formation method: ALD

Raw material gas: tetrachlorotitanium ($TiCl_4$), hexachlorodisilane (HCDS)

Reaction gas: hydrazine ($N_2H_4$), monomethylhydrazine (MMH), ammonia ($NH_3$)

Volumetric flow ratio of reaction gas (mixed gas): listed in Tables 1, 2 and 3

Partial pressure of raw material gas: 0.004 (Torr)

Partial pressure of reaction gas: 0.04 (Torr)

Film formation temperature: listed in Tables 1, 2, and 3

Performed 3 steps: See Table 2 for details

<ALD Cycle>

Examples 1 to 3, 5 to 7, and Comparative Examples 1 to 5 were formed by Method 3 described above.

Step 3A: The raw material gas containing the metal compound raw material was supplied to the substrate in the processing chamber for 2 seconds.

Step 3B: The supply of the raw material gas was stopped, and the inert gas was supplied into the processing chamber for 10 seconds.

Step 3C: The supply of the inert gas was stopped, and the reaction gas containing the nitrogen-containing compound raw material was supplied to the substrate in the processing chamber for 2 seconds.

Step 3D: The supply of the reaction gas was stopped, and the inert gas was supplied into the processing chamber for 10 seconds.

Step 3E: The supply of the inert gas was stopped.

The number of repetitions of the cycle: 1000 times

In Comparative Example 1 and Example 2 (film formation temperature: 400° C.), investigations were conducted on the number of cycles (100, 300, 500, and 1000 cycles) depending on the film thickness in order to confirm the incubation time.

In Example 4, a thin film was produced by Method 7 described above.

Step 7A: The raw material gas containing the metal compound raw material was supplied to the substrate in the processing chamber for 2 seconds.

Step 7B: The supply of the raw material gas is stopped, and the inert gas was supplied into the processing chamber for 10 seconds.

Step 7C: The supply of the inert gas was stopped, and the first reaction gas containing ammonia was supplied to the substrate in the processing chamber for 2 seconds.

Step 7D: The supply of the first reaction gas was stopped, and the inert gas was supplied into the processing chamber for 10 seconds.

Step 7E: The supply of the inert gas was stopped, and the second reaction gas containing the nitrogen-containing compound raw material was supplied to the substrate in the processing chamber for 2 seconds.

Step 7F: The supply of the second reaction gas was stopped, and the inert gas was supplied into the processing chamber for 10 seconds.

Step 7G: The supply of the inert gas was stopped.

The number of repetitions of the cycle: 1000 times

<Evaluation Results>

The evaluation results of the thin films are shown in Tables 1 to 4.

[Titanium Nitride Film]

(1) GPC and Film Quality

As shown in Table 1, compared with Comparative Example 1, Comparative Example 2 using hydrazine as the reaction gas generally increased the GPC at each film formation temperature, and formed a titanium nitride film (TiN) having good quality.

In particular, as shown in Comparative Example 1, when ammonia was used as the reaction gas, the GPC decreased as the film formation temperature decreased, and the refractive index tended to exceed 1.8.

On the other hand, as shown in Comparative Example 2, when hydrazine was used as the reaction gas, the GPC tended to be improved and there was no difference in refractive index.

This is because hydrazine ($N_2H_4$) has higher reactivity than ammonia ($NH_3$), so the nitriding reaction progressed even in the region at which the film formation temperature was low.

In Examples 1 to 3, the mixed gas of hydrazine and ammonia was used as the reaction gas. Although the volumetric flow rate ratio of hydrazine was lower than that of Comparative Example 2, the GPC and film quality were equal to or higher than those of Comparative Example 2.

As shown in the results of Example 1, when the mixed gas with a volumetric flow ratio ($N_2H_4$:$NH_3$) of 50:50 was used as the reaction gas, the film formation quality (improved GPC, decreased refractive index) was better than that of Comparative Example 2 in which hydrazine alone was used as the reaction gas.

Compared with Comparative Example 1 in which ammonia alone was used as the reaction gas, in Example 3, even when the mixed gas with the volumetric flow ratio reduced to 1:99 was used as the reaction gas, the film formation quality (GPC) was improved, the refractive index was decreased, and almost the same results as in Comparative Example 2 using hydrazine alone as the reaction gas were obtained.

It was confirmed that, in Examples 1 to 3, a mixed-gas of hydrazine and ammonia was used as the reaction gas, and even if the flow rate of hydrazine ($N_2H_4$) supplied was reduced, almost the same film formation results as in Comparative Example 2 in which hydrazine alone was used as the reaction gas were obtained. Moreover, it was found that Examples 1 to 3 can reduce the cost by 50% or more compared with Comparative Example 2 using hydrazine alone as the reaction gas.

(2) Impurities in Film

As shown in Table 1, compared with Comparative Example 1, Comparative Example 2 using hydrazine as the reaction gas tended to have less impurities such as chlorine and oxygen in the film at each film formation temperature.

In particular, as shown in Comparative Example 1, when ammonia was used as the reaction gas, the amount of chlorine and oxygen in the film increased sharply when the film formation temperature was below 350° C. The increase in the amount of chlorine in the film was due to the fact that as the film formation temperature became lower, the nitriding energy was insufficient for the $TiCl_4$ structure adsorbed on the surface of the substrate, and the nitriding reaction did not progress (that is, many Ti—Cl bonds remained in the film).

The increase in the amount of oxygen in the film was due to the fact that the nitriding reaction did not progress, a rough film was formed, and oxygen and moisture in the atmosphere were mixed into the film.

On the other hand, as shown in Comparative Example 2, when hydrazine was used as the reaction gas, the nitriding power of hydrazine was high, so that even when the film formation temperature was lower than 350° C., a titanium nitride film having good quality with less impurities in the film than in Comparative Example 1 was formed.

Examples 1 to 3 used the mixed gas of hydrazine and ammonia as the reaction gas, and although the volumetric flow ratio of hydrazine was reduced compared to Comparative Example 2, the amount of impurities in the film was about the same as in Comparative Example 2.

As shown in the results of Example 3, even when the mixed gas with the volumetric flow ratio reduced to 1:99 was used as the reaction gas, compared with Comparative Example 1 in which only ammonia was used as the reaction gas, there were few impurities.

From the above results, it was found that a titanium nitride film with few impurities could be obtained by using the mixed gas containing even a small amount of hydrazine in ammonia as the reaction gas.

On the other hand, in Comparative Examples 3 and 4 in which monomethylhydrazine (MMH) was used as the hydrazine compound, the amount of chlorine in the film was the same as when hydrazine ($N_2H_4$) was used, but the film was contaminated with carbon derived from hydrocarbons possessed by monomethyl hydrazine.

(3) Electrical Properties

As shown in Table 1, compared with Comparative Example 1, Comparative Example 2 using hydrazine as the reaction gas tended to have lower electrical resistivity at each film formation temperature.

In particular, as shown in Comparative Example 1, when ammonia was used as the reaction gas, it was confirmed that the film formation temperature tended to be 350° C. or lower.

On the other hand, as shown in Comparative Example 2, when hydrazine was used as the reaction gas, it was confirmed that good resistivity with little difference in the film formation temperature was obtained.

The reason why the electrical resistivity increased when only ammonia was used as the reaction gas was presumed to be that the lower the film formation temperature, the more impurities remained in the film, and the film quality deteriorated significantly.

Examples 1 to 3 used the mixed gas of hydrazine and ammonia as the reaction gas, and although the volumetric flow ratio of hydrazine was reduced compared to Comparative Example 2, the electric resistivity in Examples 1 to 3 was equivalent to or higher than that in Comparative Example 2.

As shown in the results of Example 1, when the mixed gas with a volumetric flow ratio ($N_2H_4$:$NH_3$) of 50:50 was used as the reaction gas, the electric resistivity in Example 1 was equal to or higher than that of Comparative Example 2.

As shown in the results of Example 3, even when the mixed gas with a volumetric flow ratio reduced to 1:99 was used as the reaction gas, the electric resistivity in Example 3 was lower than that of Comparative Example 1 and comparable to that of Comparative Example 2.

On the other hand, in Comparative Examples 3 and 4 using monomethylhydrazine (MMH) as the hydrazine compound, the electrical resistivity tended to be higher than that when the film formation temperature was 400° C. in Examples 1 to 3. It was presumed that this was because carbon derived from hydrocarbons contained in monomethylhydrazine was mixed into the film, thereby degrading the electrical resistivity.

(4) Others

As shown in Table 2, in Example 2, the incubation time could be reduced compared to Comparative Example 1 (film formation temperature: 400° C.).

From this result, the effect of reducing the incubation time by using the mixed gas of hydrazine and ammonia was confirmed.

In Comparative Example 5, hydrazine used as the reaction gas contained $H_2O$: 100 ppm, the amount of oxygen in the film was greatly increased, and electrical resistivity was greatly deteriorated.

From the above, it was confirmed that the amount of water in hydrazine, which is a nitrogen-containing compound raw material, must be 10 ppm or less, more preferably 1 ppm or less, in order to form a metal nitride film having good quality.

In Example 4, the GPC, refractive index, impurities in the film, and electrical resistivity were improved, compared with Example 2 (film formation temperature: 400° C.) in which the film was formed in two steps.

From the results, the effect of film formation in three steps was confirmed.

As shown in Table 3, Comparative Example 6 is an example in which only hydrazine was used as the reaction gas, similarly to Comparative Example 2, but the flow rate of the hydrazine supplied was reduced.

The amount of the reaction gas supplied in Comparative Example 6 was 1/100 of that in Comparative Examples 1, 2 and 3, and was the same as the flow rate of hydrazine contained in the mixed gas supplied in Example 3.

Compared with Comparative Example 2, Example 3, and Comparative Example 6, in Comparative Example 6 in which only a small amount of hydrazine was supplied as the reaction gas, a thin film was formed at a film formation temperature of 300° C., but the film quality such as electrical resistivity and the amount of impurities in the film was reduced.

Further, as shown in Comparative Example 1, it was confirmed that even if only ammonia was used as the reaction gas and the flow rate of the reaction gas supplied was increased as in Comparative Example 2 and Example 3, a thin film having inferior film quality was formed.

From the results above, it was confirmed that, when supplying a small amount of hydrazine as the reaction gas, it is necessary to include not only hydrazine but also ammonia as the raw material of the nitrogen-containing compound, which is the reaction gas, in order to form a metal nitride film having high quality. Also, as in Example 3, the effect of using the mixed gas obtained by adding a small amount of hydrazine to ammonia as the reaction gas was confirmed.

TABLE 1

| No. | Kind of film | Metal compound raw material | Nitride material (including nitrogen-containing raw material) (1) | (2) | Volumetric flow rate (1):(2) | Film formation temperature (°C) | GPC (Å/cycle) | Refractive index | Electric resistivity (μΩ·cm) | Cl (%) | O (%) | C (%) |
|---|---|---|---|---|---|---|---|---|---|---|---|---|
| Comp. Ex. 1 | TiN | $TiCl_4$ | $NH_3$ | — | — | 400 | 0.272 | 1.78 | 568 | 0.9 | 6.1 | <0.1 |
| | | | | | | 350 | 0.249 | 1.79 | 802 | 2.4 | 10.5 | <0.1 |
| | | | | | | 300 | 0.207 | 2.06 | 1240 | 6.1 | 36.5 | <0.1 |
| | | | | | | 250 | 0.101 | 2.08 | 7927 | 6.5 | 38.5 | <0.1 |
| Comp. Ex. 2 | TiN | $TiCl_4$ | $N_2H_4$ | — | — | 400 | 0.319 | 1.72 | 347 | 0.5 | 3.7 | <0.1 |
| | | | | | | 350 | 0.337 | 1.73 | 405 | 1.3 | 5.6 | <0.1 |
| | | | | | | 300 | 0.364 | 1.73 | 442 | 2.1 | 4.4 | <0.1 |
| | | | | | | 250 | 0.415 | 1.68 | 498 | 2.8 | 6.1 | <0.1 |
| Comp. Ex. 3 | TiN | $TiCl_4$ | MMH | — | — | 400 | 0.287 | 1.77 | 794 | 1.0 | 7.0 | 5.1 |
| Comp. Ex. 4 | TiN | $TiCl_4$ | MMH | $NH_3$ | 50:50 | 400 | 0.292 | 1.75 | 616 | 0.8 | 5.9 | 3.7 |
| Ex. 1 | TiN | $TiCl_4$ | $N_2H_4$ | $NH_3$ | 50:50 | 400 | 0.366 | 1.70 | 178 | 0.4 | 2.6 | <0.1 |
| | | | | | | 350 | 0.349 | 1.70 | 182 | 0.5 | 3.5 | <0.1 |
| | | | | | | 300 | 0.348 | 1.73 | 169 | 0.4 | 2.6 | <0.1 |
| | | | | | | 250 | 0.430 | 1.71 | 333 | 1.5 | 3.1 | <0.1 |
| Ex. 2 | TiN | $TiCl_4$ | $N_2H_4$ | $NH_3$ | 10:90 | 400 | 0.313 | 1.73 | 372 | 0.7 | 4.7 | <0.1 |
| | | | | | | 350 | 0.331 | 1.71 | 391 | 0.8 | 4.1 | <0.1 |
| | | | | | | 300 | 0.363 | 1.70 | 462 | 1.8 | 2.5 | <0.1 |
| | | | | | | 250 | 0.399 | 1.69 | 508 | 2.0 | 2.0 | <0.1 |
| Ex. 3 | TiN | $TiCl_4$ | $N_2H_4$ | $NH_3$ | 1:99 | 400 | 0.309 | 1.70 | 345 | 0.4 | 2.6 | <0.1 |
| | | | | | | 350 | 0.317 | 1.69 | 412 | 0.6 | 2.9 | <0.1 |
| | | | | | | 300 | 0.307 | 1.65 | 502 | 2.2 | 4.4 | <0.1 |
| | | | | | | 250 | 0.391 | 1.71 | 993 | 3.5 | 3.0 | <0.1 |

TABLE 2

| No. | Kind of film | Metal compound raw material | Nitride material (including nitrogen-containing raw material) (1) | (2) | Volumetric flow rate (1):(2) | Film formation temp. (°C) | Amount of $H_2O$ in nitrogen-containing compound (ppm) | GPC (Å/cycle) | Refractive index | Electric resistivity (μΩ·cm) | Amount in TiN film Cl (%) | O (%) | Incubation time (cycle) | Step number |
|---|---|---|---|---|---|---|---|---|---|---|---|---|---|---|
| Comp. Ex. 1 | TiN | $TiCl_4$ | $NH_3$ | — | — | 400 | <1 | 0.272 | 1.78 | 568 | 0.9 | 6.1 | 13 | 2 |
| Ex. 2 | TiN | $TiCl_4$ | $N_2H_4$ | $NH_3$ | 10:90 | 400 | <1 | 0.313 | 1.73 | 372 | 0.7 | 4.7 | 5 | 2 |
| Comp. Ex. 5 | TiN | $TiCl_4$ | $N_2H_4$ | — | — | 400 | 100 | 0.382 | 1.91 | 2908 | 0.9 | 16.7 | — | 2 |
| Ex. 4 | TiN | $TiCl_4$ | $N_2H_4$ | $NH_3$ | 10:90 | 400 | <0.1 | 0.371 | 1.67 | 315 | 0.8 | 3.4 | — | 3 ($NH_3 \rightarrow N_2H + NH_3$) |

TABLE 3

| No. | Kind of film | Metal compound raw material | Nitride material (including nitrogen-containing raw material) (1) | (2) | Volumetric flow rate (1):(2) | Flow rate ratio of nitride material (/Comp. 2) | Film formation temp. (°C) | GPC (Å/cycle) | Refractive index | Electric resistivity (μΩ·cm) | Amount in TiN film (%) Cl (%) | O (%) |
|---|---|---|---|---|---|---|---|---|---|---|---|---|
| Comp. Ex. 1 | TiN | $TiCl_4$ | $NH_3$ | — | — | 1.0 | 300 | 0.207 | 2.06 | 1240 | 6.1 | 36.5 |
| Comp. Ex. 2 | TiN | $TiCl_4$ | $N_2H_4$ | — | — | 1.0 | 300 | 0.364 | 1.73 | 442 | 2.1 | 4.4 |
| Ex. 3 | TiN | $TiCl_4$ | $N_2H_4$ | $NH_3$ | 1:99 | 1.0 | 300 | 0.307 | 1.65 | 502 | 2.2 | 4.4 |
| Comp. Ex. 6 | TiN | $TiCl_4$ | $N_2H_4$ | — | — | 0.01 | 300 | 0.164 | 1.83 | 5322 | 7.2 | 16.0 |

[Silicon Nitride Film]

As shown in Table 4, compared with Comparative Example 7, the silicon nitride film of Comparative Example 8 using hydrazine as the reaction gas was generally excellent in GPC and hydrofluoric acid resistance at each film formation temperature, and had good quality.

This is because hydrazine ($N_2H_4$) has higher reactivity than ammonia ($NH_3$), so the nitriding reaction progressed even if the film formation temperature was low.

As shown in the results of Example 5, when the mixed gas with a volumetric flow ratio ($N_2H_4:NH_3$) of 50:50 was used as the reaction gas, the silicon nitride thin film had the same level of GPC, refractive index, and hydrofluoric acid resistance as those of the silicon nitride film in Comparative Example 8 using only hydrazine as the reaction gas.

As shown in the results of Example 6, even when the mixed gas with a volumetric flow ratio reduced to 1:99 was used as the reaction gas, the produced silicon nitride film was superior in GPC and hydrofluoric acid resistance to those of the silicon nitride film produced in Comparative Example 7 using only ammonia as the reaction gas. Also, the amount of impurities in the films in Examples 6 and 7 was equivalent to those in Comparative Example 8 using hydrazine alone as the reaction gas.

From the results above, in the case of forming a silicon nitride film, by using the mixed gas of hydrazine and ammonia as the reaction gas, the flow rate of hydrazine ($N_2H_4$) supplied can be reduced, and the obtained silicon nitride film had film formation results approximately the same as those of Comparative Example 7 using ammonia alone as the reaction gas. Moreover, in Examples 5 to 7, the cost could be reduced by 50% or more as compared with Comparative Example 8 using only hydrazine as the reaction gas.

Also, it was confirmed that when a small amount of hydrazine is supplied as the reaction gas, in order to produce a silicon nitride film with few impurities, it is necessary to include not only hydrazine but also ammonia as the nitrogen-containing compound raw material which is the reaction gas.

The other results also had the same tendency as the results of the film formation evaluation of the titanium nitride film.

[Other Nitride Films]

For other nitride films, the same tendency as the film formation evaluation results of the titanium nitride films and the silicon nitride films was observed.

As the raw material gas for forming other nitride films, tantalum pentachloride ($TaCl_5$) was used for forming a tantalum nitride film (TaN); trimethylaluminum (TMA) or aluminum chloride ($AlCl_3$) was used for forming an aluminum nitride (AlN) film; and gallium chloride ($GaCl_3$) or trimethylgallium (TMG) was used for forming a gallium nitride (GaN) film.

EXPLANATION OF REFERENCE NUMERALS 1 film-forming device
2 processing chamber
3 temperature control device
4 decompression device
10, 20, 30, 40, 50, 60, 70 device for supplying a mixed gas
11 raw material container
12 heater
13 heater control device
14 dilution gas flow rate control device
    ammonia flow rate control device
16 mixed gas flow meter
17 arithmetic device
18 pipe heater
31 first pressure gauge
32 on-off valve
33 pressure control device
34 buffer tank (storage tank)
35 second pressure gauge
36 on-off valve control device
41 setting device
P substrate to be processed (substrate)
L1 purge gas supply passage
L2 exhaust passage
L3 raw material gas supply passage
L4 reaction gas supply passage
L11 introduction passage
L12 lead-out passage

TABLE 4

| No. | Kind of film | Metal compound raw material | Nitride material (including nitrogen-containing raw material) (1) | (2) | Volumetric flow rate (1):(2) | Film formation temp. | GPC (Å/cycle) | Refractive index | hydrofluoric acid resistance (Å/min.) | Amount in SiN film Cl (%) | O (%) | C (%) |
|---|---|---|---|---|---|---|---|---|---|---|---|---|
| Comp. Ex. 7 | SiN | HCDS | $NH_3$ | — | — | 550 | 0.370 | 1.90 | 9.2 | 0.9 | 5.1 | <0.1 |
| | | | | | | 500 | 0.274 | 1.89 | 24.6 | 1.7 | 5.0 | <0.1 |
| | | | | | | 450 | 0.102 | 1.48 | 200.0 | 3.1 | 35.0 | <0.1 |
| | | | | | | 400 | N.D. | — | — | — | — | — |
| Comp. Ex. 8 | SiN | HCDS | $N_2H_4$ | — | — | 550 | 0.530 | 1.99 | 3.2 | 0.5 | 4.7 | <0.1 |
| | | | | | | 500 | 0.392 | 2.00 | 1.9 | 0.4 | 3.5 | <0.1 |
| | | | | | | 450 | 0.226 | 1.95 | 10.4 | 0.7 | 5.3 | <0.1 |
| | | | | | | 400 | 0.199 | 1.89 | 16.6 | 0.9 | 5.1 | <0.1 |
| Ex. 5 | SiN | HCDS | $N_2H_4$ | $NH_3$ | 50:50 | 550 | 0.546 | 2.05 | 4.4 | 0.7 | 4.7 | <0.1 |
| | | | | | | 500 | 0.404 | 2.06 | 4.3 | 0.9 | 3.8 | <0.1 |
| | | | | | | 450 | 0.241 | 1.97 | 12.9 | 1.9 | 4.9 | <0.1 |
| | | | | | | 400 | 0.217 | 1.91 | 19.3 | 2.5 | 5.5 | <0.1 |
| Ex. 6 | SiN | HCDS | $N_2H_4$ | $NH_3$ | 10:90 | 550 | 0.531 | 2.01 | 6.1 | 0.9 | 5.2 | <0.1 |
| | | | | | | 500 | 0.395 | 2.02 | 11.7 | 1.6 | 5.5 | <0.1 |
| | | | | | | 450 | 0.225 | 1.93 | 20.6 | 2.9 | 5.1 | <0.1 |
| | | | | | | 400 | 0.205 | 1.87 | 32.3 | 3.7 | 6.0 | <0.1 |
| Ex. 7 | SiN | HCDS | $N_2H_4$ | $NH_3$ | 1:99 | 550 | 0.378 | 1.99 | 5.9 | 0.9 | 4.8 | <0.1 |
| | | | | | | 500 | 0.280 | 1.98 | 12.8 | 1.8 | 5.0 | <0.1 |

L13 dilution gas supply passage
L14, L24 ammonia supply passage
L15 mixed gas lead-out passage
L16 bypass passage
L17 mixed gas-branching passage
L18 mixed gas-merging passage
V1~V4 first to fourth on-off valve

The invention claimed is:

1. A device for supplying a mixed gas which supplies the mixed gas containing a hydrazine compound and ammonia as a nitrogen-containing compound raw material,
   wherein the device for supplying the mixed gas includes:
   a raw material container which stores the hydrazine compound;
   a heater which is located around the raw material container and is configured to heat the raw material container;
   a heater controller configured to adjust an output of the heater;
   an introduction passage which introduces a carrier gas into the raw material container,
   a lead-out passage which leads out a gas containing the hydrazine compound from the raw material container;
   a dilution gas supply passage which supplies a dilution gas,
   an ammonia supply passage which supplies the ammonia,
   wherein the carrier gas is at least one of the dilution gas and the ammonia,
   a mixed gas lead-out passage which is connected with the lead-out passage, and leads out the mixed gas;
   a dilution gas flow rate controller which is located in the mixed gas lead-out passage, and is configured to control a flow rate of the dilution gas supplied into the dilution gas supply passage;
   an ammonia flow rate controller which is located in the ammonia supply passage and is configured to control a flow rate of ammonia supplied into the ammonia supply passage;
   a mixed gas flow meter which is located in the mixed gas lead-out passage and measures a flow rate of the mixed gas which is led out into the mixed gas lead-out passage, and
   an arithmetic calculator configured to calculate a flow rate of the hydrazine compound contained in the mixed gas based on values of flow rate of the dilution gas which is supplied into the dilution gas supply passage, the ammonia which is supplied into the ammonia supply passage, and the mixed gas which is led-out into the mixed gas lead-out passage;
   wherein the ammonia supply passage is connected to at least one of the introduction passage, the lead-out passage, and the mixed gas lead-out passage, and
   wherein the dilution gas supply passage is connected to at least one of the introduction passage and the lead-out passage.

2. The device for supplying the mixed gas according to claim 1,
   wherein the device for supplying the mixed gas further includes a bypass passage which is branched from the introduction passage and merges with the lead-out passage without passing through the raw material container.

3. The device for supplying the mixed gas according to claim 1,
   wherein the device for supplying the mixed gas further includes:

a first pressure gauge which is located in the lead-out passage and measures pressure in the raw material container;
   an on-off valve which is located in the lead-out passage or the mixed gas lead-out passage and of which an opening can be adjusted; and
   a pressure controller configured to control an opening of the on-off valve based on a measured value of the first pressure gauge.

4. The device for supplying the mixed gas according to claim 3,
   wherein the device for supplying the mixed gas further includes:
   a storage tank which is located in the mixed gas lead-out passage and stores the mixed gas;
   a second pressure gauge which measures pressure in the storage tank; and
   a flow path selection device which selects an open/closed state of the ammonia supply passage and the lead-out passage based on measured values of the first pressure gauge and the second pressure gauge.

5. The device for supplying the mixed gas according to claim 1,
   wherein the arithmetic calculator is configured to calculate a difference between a calculated flow rate and a set flow rate of the hydrazine compound, and configured to update a set value of the heater controller based on the difference.

6. The device for supplying the mixed gas according to claim 1,
   wherein the arithmetic calculator is configured to calculate a difference between a calculated content ratio and a set content ratio of the hydrazine compound contained in the mixed gas, and configured to update set values of the dilution gas flow rate controller and the ammonia flow rate controller based on the difference.

7. The device for supplying the mixed gas according to claim 3,
   wherein the arithmetic calculator is configured to calculate a difference between a calculated content ratio and a set content ratio of the hydrazine compound contained in the mixed gas, and configured to update a set value of the pressure controller based on the difference.

8. The device for supplying the mixed gas according to claim 1,
   wherein a concentration of $H_2O$ contained in the nitrogen-containing compound raw material is 0.1 ppm or less.

9. The device for supplying the mixed gas according to claim 1,
   wherein a concentration of $H_2O$ contained in the hydrazine compound is 10 ppm or less.

10. The device for supplying the mixed gas according to claim 1,
   wherein the hydrazine compound is hydrazine ($N_2H_4$).

11. A device for producing a metal nitride film in which a metal nitride film is formed on at least a part of a surface of a substrate to be processed by chemical vapor deposition using a metal compound raw material and a nitrogen-containing compound raw material,
   wherein the device for producing the metal nitride film includes the device for supplying the mixed gas according to claim 1.

12. The device for supplying the mixed gas according to claim 1, wherein the hydrazine compound accompanies the carrier gas.

* * * * *